(12) United States Patent
Yokoyama et al.

(10) Patent No.: US 7,615,792 B2
(45) Date of Patent: Nov. 10, 2009

(54) LIGHT-EMITTING DEVICE, METHOD OF MANUFACTURING THE SAME, AND DISPLAY UNIT

(75) Inventors: Seiichi Yokoyama, Kanagawa (JP); Koji Hanawa, Kanagawa (JP); Takanori Shibasaki, Kanagawa (JP); Takashi Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/621,745

(22) Filed: Jan. 10, 2007

(65) Prior Publication Data

US 2007/0114526 A1 May 24, 2007

Related U.S. Application Data

(63) Continuation of application No. 10/805,133, filed on Mar. 19, 2004, now Pat. No. 7,250,634.

(30) Foreign Application Priority Data

| Mar. 26, 2003 | (JP) | ............................. 2003-085868 |
| May 29, 2003 | (JP) | ............................. 2003-153053 |
| Aug. 22, 2003 | (JP) | ............................. 2003-299258 |

(51) Int. Cl.
*H01L 27/15* (2006.01)
*H01L 29/16* (2006.01)
*H01L 31/12* (2006.01)

(52) U.S. Cl. ..................... 257/83; 257/E33.064; 438/24

(58) Field of Classification Search ................. 257/83, 257/E33.064

See application file for complete search history.

(56) References Cited

U.S. PATENT DOCUMENTS 6,444,334 B1 * 9/2002 Doi et al. ..................... 428/690

(Continued)

FOREIGN PATENT DOCUMENTS

JP  09-305126  11/1997

(Continued)

OTHER PUBLICATIONS

Japanese Office Action dated May 8, 2008.

(Continued)

*Primary Examiner*—Sue Purvis
*Assistant Examiner*—Benjamin P Sandvik
(74) *Attorney, Agent, or Firm*—K & L Gates LLP

(57) ABSTRACT

Light-emitting devices capable of preventing separation or alteration of a first electrode to obtain high performance, methods of manufacturing the light-emitting device, and display units are provided. A first electrode as an anode, an insulating film, an organic layer including a light-emitting layer, and a second electrode as a cathode are laminated in this order on a substrate with a planarizing layer as a base layer in between. The first electrode has a structure in which an adhesive layer, a reflective layer and a barrier layer is laminated in this order from the substrate. Alteration of the reflective layer can be prevented by the barrier layer, and the reflective layer can be prevented from being separated from the planarizing layer by the adhesive layer. The first electrode is formed through forming the adhesive layer, the reflective layer and the barrier layer on the planarizing layer, and then patterning them in order from the barrier layer.

24 Claims, 17 Drawing Sheets

U.S. PATENT DOCUMENTS

| | | | |
|---|---|---|---|
| 6,476,416 B1 * | 11/2002 | Ikeda | 257/59 |
| 2001/0011868 A1 * | 8/2001 | Fukunaga et al. | 313/506 |
| 2003/0067266 A1 * | 4/2003 | Kim et al. | 313/504 |

FOREIGN PATENT DOCUMENTS

| JP | 11-119664 | 4/1999 |
|---|---|---|
| JP | 11-282383 | 10/1999 |
| JP | 2002-229483 | 8/2002 |
| JP | 2003-016821 | 1/2003 |

OTHER PUBLICATIONS

Japanese Office Action corresponding to 2003-299258 dated Apr. 28, 2009.

* cited by examiner

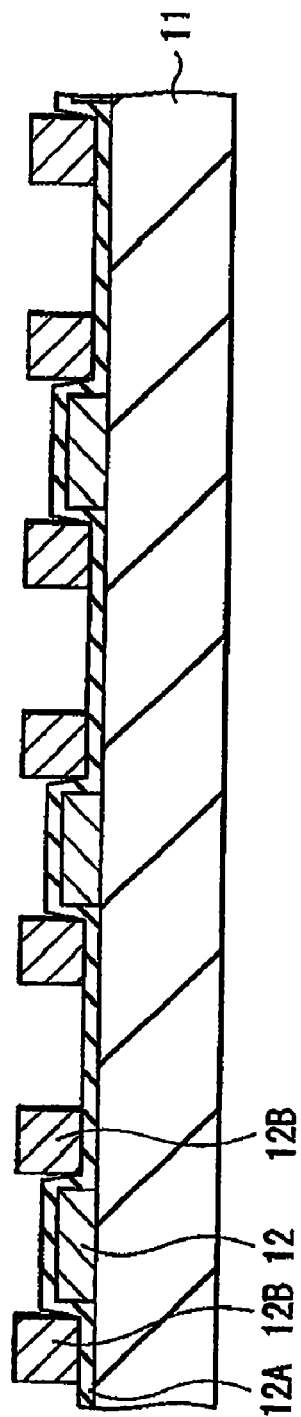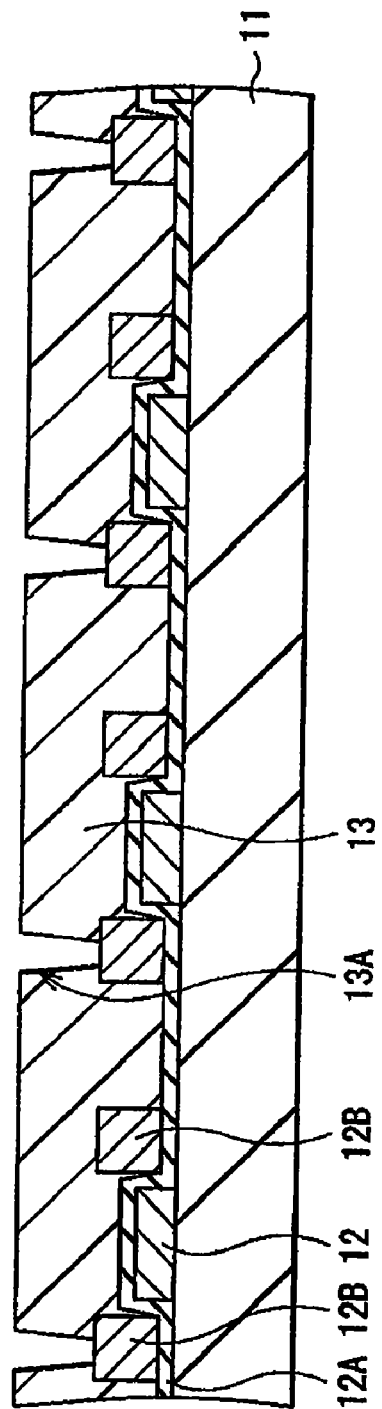

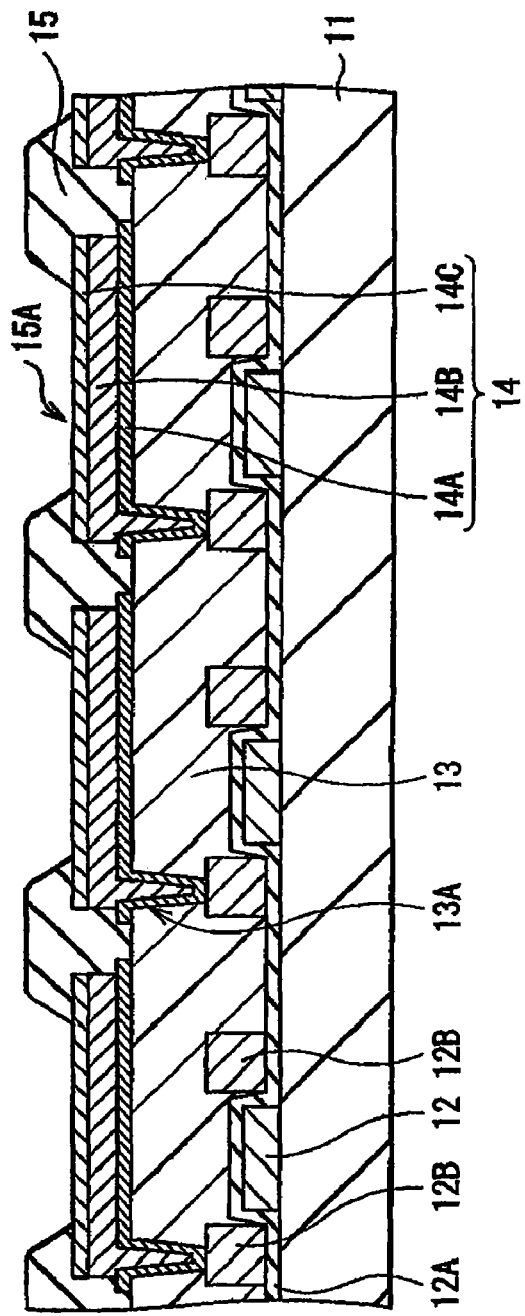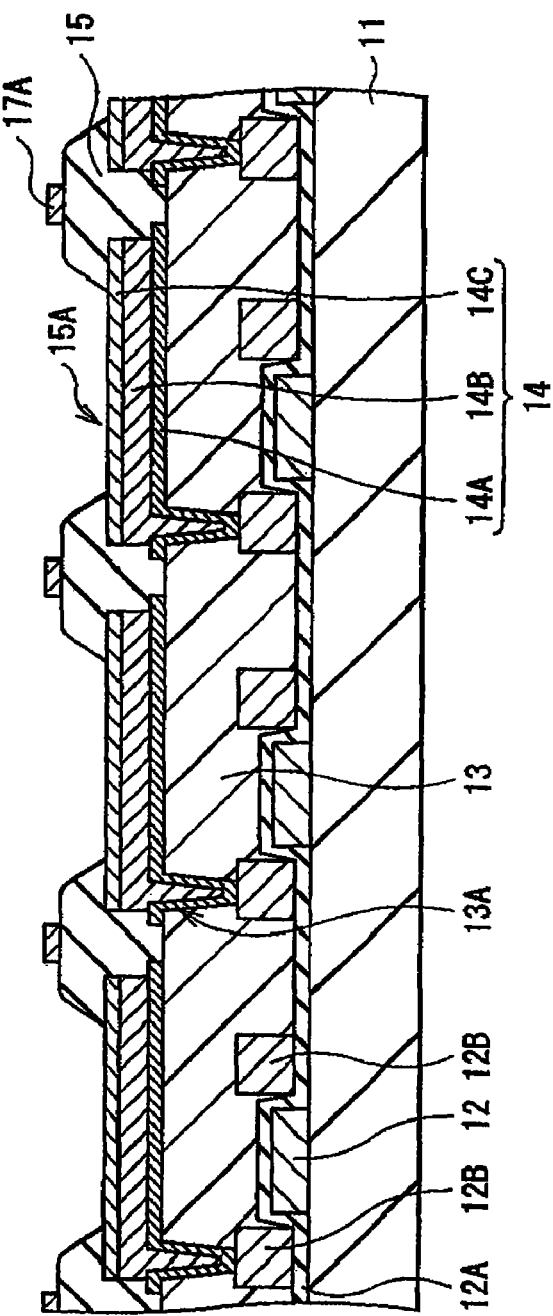
FIG. 7A
FIG. 7B

LIGHT-EMITTING DEVICE, METHOD OF MANUFACTURING THE SAME, AND DISPLAY UNIT

CROSS REFERENCES TO RELATED APPLICATIONS

This application is a continuation of U.S. patent application Ser. No. 10/805,133 filed on Mar. 19, 2004, which claims priority to Japanese Patent Application Nos. P2003-085868, filed on Mar. 26, 2003; P2003-153053, filed on May 29, 2003; and P2003-299258 filed Aug. 22, 2003, the disclosures of which are herein incorporated by reference.

BACKGROUND

The present invention relates to a light-emitting device reflecting light generated in a light-emitting layer by a first electrode to extract the light from a second electrode side, a method of manufacturing the light-emitting device, and a display unit using the light-emitting device.

In recent years, as one of flat panel displays, an organic light-emitting display using an organic light-emitting device has become a focus of attention. The organic light-emitting display is of a self-luminous type, so it is considered that the organic light-emitting display has advantages of a wide viewing angle, low power consumption and adequate response to high-definition high-speed video signals. Therefore, the development of the organic light-emitting displays toward practical utilization has been proceeding.

As the organic light-emitting device, for example, a laminate including a first electrode, an organic layer including a light-emitting layer, and a second electrode with a TFT (thin film transistor), a planarizing layer and the like in between in order on a substrate is known. Light generated in the light-emitting layer may be extracted from the substrate side or the second electrode side.

As an electrode where light is extracted, in many cases, a transparent electrode made of an electrically conductive material with transparency such as a compound including indium (In), tin (Sn), oxygen (O), indium tin oxide (ITO) and the like is used. Various structures of the transparent electrode have previously been proposed. For example, in order to prevent an increase in cost due to an increase in the thickness of an ITO film, a transparent electrode including a laminate of a metal thin film made of silver (Ag) or the like and a high refractive index film made of zinc oxide (ZnO) or the like has been proposed (for example, refer to Japanese Unexamined Patent Application Publication No. 2002-334792). In the transparent electrode, the high refractive index film has a thickness of 5 nm to 350 nm, and the metal thin film has a thickness of 1 nm to 50 nm, so the high refractive index film is relatively thicker than the metal thin film, thereby the transparency of the transparent electrode is increased, and reflection by a surface of the metal thin film can be reduced by the high refractive index film.

In many cases, as an electrode where light is not extracted, various metal electrodes are used. For example, when light is extracted from the second electrode side, the first electrode as an anode is made of, for example, a metal such as chromium (Cr). Conventionally, for example, a first electrode with two-layer structure including a metallic material layer made of chromium and a buffer thin film layer made of an oxide including chromium has been proposed, thereby the surface roughness of chromium of the metallic material layer is reduced by the buffer thin film layer (for example, refer to Japanese Unexamined Patent Application Publication No. 2002-216976).

When light is extracted from the second electrode side, light generated in the light-emitting layer may be directly extracted through the second electrode, or may be reflected by the first electrode once to be emitted through the second electrode. Conventionally, the first electrode is made of chromium or the like, so there is a problem that the light absorptance of the first electrode is large, thereby a loss of light reflected by the first electrode to be extracted is large. The light absorptance of the first electrode has a large influence on the organic light-emitting device, so when the light-emitting efficiency is lower, a larger amount of current is required in order to obtain the same intensity. An increase in the amount of drive current has a large influence on the life of the organic light-emitting device which is extremely important for practical use of the organic light-emitting device.

Therefore, for example, it is considered that the first electrode is made of silver (Ag) with the highest reflectance among metals or an alloy including silver. However, silver has properties such that its reactivity is extremely high, it is difficult to be processed, and its adhesion is low. Therefore, in order to achieve a chemically stable first electrode with high reflectance through making full use of advantages of silver, the structure and the manufacturing process of the first electrode are susceptible to further improvement.

SUMMARY

In view of the foregoing, the present invention provides a light-emitting device capable of preventing separation or alteration of a first electrode to obtain high performance, a method of manufacturing the light-emitting device, and a display unit.

A light-emitting device according to an embodiment of the invention includes a first electrode, a layer including a light-emitting layer and a second electrode laminated in this order on a substrate with a base layer in between, and extracts light generated in the light-emitting layer from the second electrode, wherein the first electrode includes an adhesive layer disposed in contact with the base layer; a reflective layer disposed on the adhesive layer to reflect the light generated in the light-emitting layer; and a barrier layer disposed on the reflective layer to protect the reflective layer.

In a method of manufacturing a light-emitting device according to an embodiment of the invention, the light-emitting device includes a first electrode, a layer including a light-emitting layer and a second electrode laminated in order on a substrate with a base layer in between, and the method includes the steps of forming an adhesive layer on the base layer; forming a reflective layer reflecting light generated in the light-emitting layer on the adhesive layer; forming a barrier layer protecting the reflective layer on the reflective layer; forming the first electrode through patterning the barrier layer, the reflective layer and the adhesive layer in order from the barrier layer; forming the layer including the light-emitting layer on the first electrode; and forming the second electrode on the layer including the light-emitting layer.

A display unit according to an embodiment of the invention includes a light-emitting device comprising a first electrode, a layer including a light-emitting layer and a second electrode laminated in order on a substrate with a base layer in between, and extracting light generated in the light-emitting layer from the second electrode, wherein the first electrode includes: an adhesive layer disposed in contact with the base layer; a reflective layer disposed on the adhesive layer to reflect the light generated in the light-emitting layer; and a barrier layer disposed on the reflective layer to protect the reflective layer.

In the light-emitting device according to an embodiment of the invention and the display unit according to the invention, the first electrode includes the adhesive layer disposed in contact with the base layer, the reflective layer reflecting the light generated in the light-emitting layer, and the barrier layer protecting the reflective layer, so alteration of the reflective layer can be prevented by the barrier layer, and the reflective layer can be prevented from being separated from the base layer by the adhesive layer, thereby the possibility that the alteration of the reflective layer from a separated portion thereof can be eliminated. Therefore, it is suitable specifically in the case where the reflective layer is made of silver (Ag) or an alloy including silver.

In the method of manufacturing a light-emitting device according to an embodiment of the invention, after the adhesive layer, the reflective layer and the barrier layer are formed in order on the base layer, the barrier layer, the reflective layer and the adhesive layer are patterned in order from the barrier layer to form the first electrode. Next, the layer including the light-emitting layer is formed on the first electrode, and then the second electrode is formed on the layer.

In the light-emitting device according to an embodiment of the invention or the display unit according to the invention, the first electrode has a structure in which the adhesive layer, the reflective layer and the barrier layer are laminated, so separation or alteration of the reflective layer can be prevented, thereby the occurrence of a short circuit between the first electrode and the second electrode due to the alteration of the reflective layer can be prevented. Therefore, it is suitable specifically in the case where the reflective layer is made of silver (Ag) or an alloy including silver, and defects in the display unit can be reduced, and the life of the display unit can be extended.

In the method of manufacturing a light-emitting device according to an embodiment of the invention, after the adhesive layer, the reflective layer and the barrier layer are formed on the base layer, they are patterned in order from the barrier layer to form the first electrode, so the material of the reflective layer can be prevented from reacting with oxygen or sulfur in air, and damage on the reflective layer in a manufacturing step after forming the reflective layer can be reduced. Moreover, the reflective layer can be prevented from being separated from the base layer by the adhesive layer, thereby an adverse effect on the reflective layer by air or a chemical solution entered into a separated portion of the reflective layer can be prevented.

Additional features and advantages are described herein, and will be apparent from, the following Detailed Description and the figures.

BRIEF DESCRIPTION OF THE FIGURES

FIGS. 4A and 4B are sectional views for showing steps in a method of manufacturing the display unit shown in FIG. 1.

FIGS. 7A and 7B are sectional views for showing steps following the steps in FIGS. 6A and 6B.

DETAILED DESCRIPTION

The present invention relates to a light-emitting device reflecting light generated in a light-emitting layer by a first electrode to extract the light from a second electrode side, a method of manufacturing the light-emitting device, and a display unit using the light-emitting device. Preferred embodiments of the present invention will be described in more detail below referring to the accompanying drawings.

Figure 1:
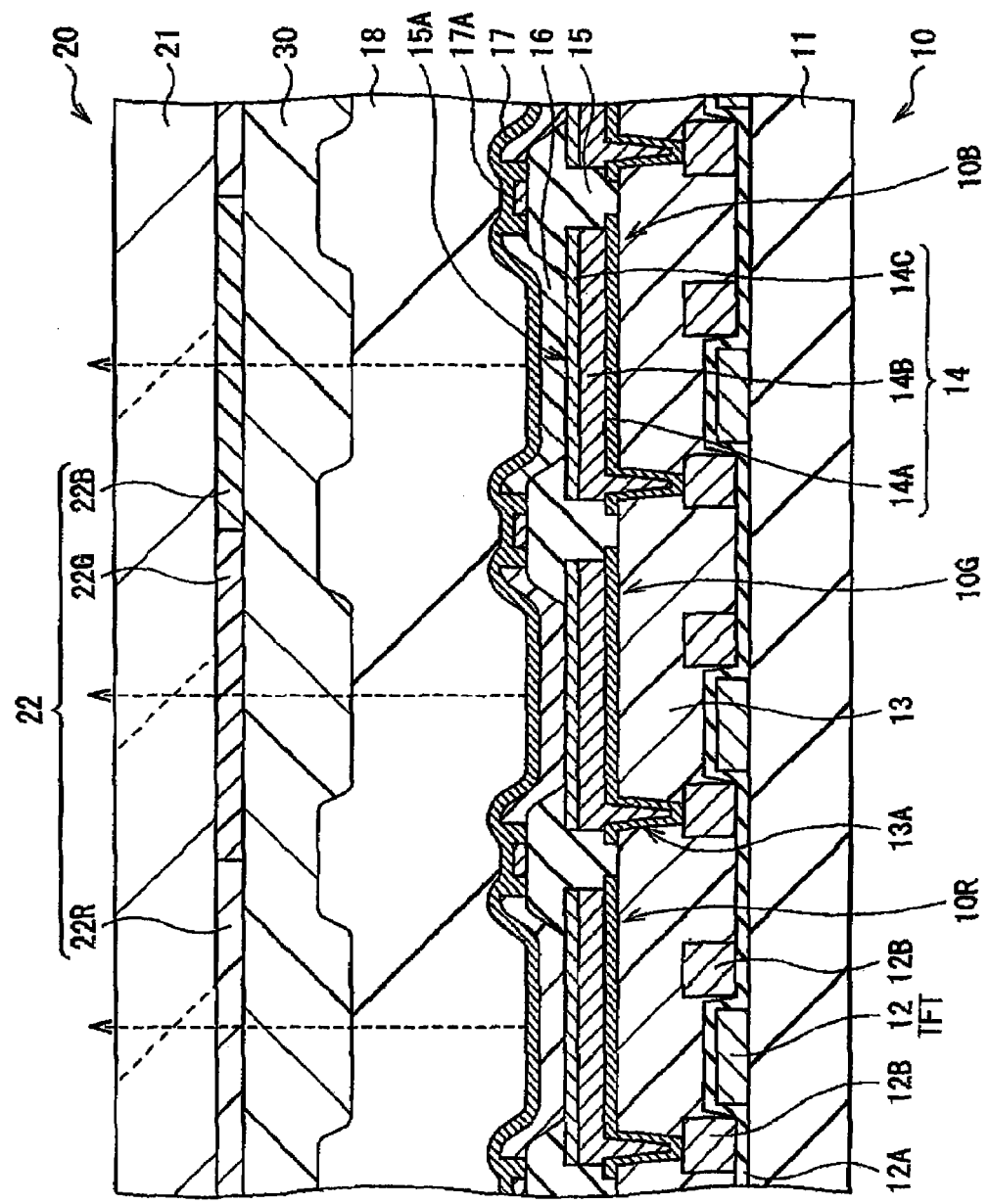
FIG. 1 is a sectional view of a display unit according to a first embodiment of the invention.

FIG. 1 shows a sectional view of a display unit according to a first embodiment of the invention. The display unit is used as an ultra-thin organic light-emitting display, and in the display unit, for example, a drive panel 10 and a sealing panel 20 faces each other, and the whole facing surfaces thereof are bonded together with an adhesive layer 30 made of a thermosetting resin. The drive panel 10 includes an organic light-emitting device 10R emitting red light, an organic light-emitting device 10G emitting green light and an organic light-emitting device 10B emitting blue light disposed in order in a matrix shape as a whole on a substrate 11 made of, for example, an insulating material such as glass with a TFT 12 and a planarizing layer 13 in between.

A gate electrode (not shown) of the TFT 12 is connected to a scanning circuit (not shown), and a source and a drain (both not shown) are connected to a wiring 12B through an interlayer insulating film 12A made of, for example, silicon oxide, PSG (phosphosilicate glass) or the like. The wiring 12B is connected to the source and the drain of the TFT 12 through a connecting hole (not shown) disposed in the interlayer insulating film 12A to function as a signal line. The wiring 12B is made of, for example, aluminum (Al) or an aluminum (Al)-copper (Cu) alloy. The structure of the TFT 12 is not specifically limited, and may be of a bottom gate structure or a top gate structure.

The planarizing layer 13 is a base layer for planarizing a surface of the substrate 11 where the TFT 12 is formed so as to form the organic light-emitting devices 10R, 10G and 10B with uniform thicknesses. In the planarizing layer 13, a connecting hole 13A is disposed to connect a first electrode 14 of each of the organic light-emitting devices 10R, 10G and 10B to the wiring 12B. In the planarizing layer 13, a minute connecting hole 13A is formed, so the planarizing layer 13 is preferably made of a material with high pattern accuracy. As the material of the planarizing layer 13, an organic material such as polyimide or an inorganic material such as silicon oxide ($SiO_2$) can be used. In the embodiment, the planarizing layer 13 is made of, for example, an organic material such as polyimide and the like.

The organic light-emitting devices 10R, 10G and 10B each include, for example, the first electrode 14 as an anode, an insulating film 15, an organic layer 16 including a light-emitting layer and a second electrode 17 as a cathode laminated in order from the substrate 11 with the planarizing layer 13 as a base layer in between. A protective film 18 is formed on the second electrode 17 if necessary.

The first electrode 14 also has a function as a reflective layer, so the first electrode 14 preferably has as high reflectance as possible so as to enhance light-emitting efficiency. In the embodiment, the first electrode 14 has a structure in which an adhesive layer 14A, a reflective layer 14B and a barrier layer 14C are laminated in order from the substrate 11. The adhesive layer 14A is disposed in contact with the planarizing layer 13 to prevent the reflective layer 14B from being separated from the planarizing layer 13. The reflective layer 14B reflects light generated in the light-emitting layer. The barrier layer 14C protects the reflective layer 14B.

The adhesive layer 14A is preferably made of, for example, a metal, an electrically conductive oxide or a metal compound including at least one type of metal elements such as chromium (Cr), indium (In), tin (Sn), zinc (Zn), cadmium (Cd), titanium (Ti), aluminum (Al), magnesium (Mg) and molybdenum (Mo), because these materials have high electrical conductivity, so a good electrical connection to the wiring 12B can be established. In an embodiment, the adhesive layer 14A is made of, for example, chromium.

The adhesive layer 14A preferably has as large a thickness in a laminate direction (hereinafter simply referred to "thickness") as light does not pass therethrough. More specifically, when the adhesive layer 14A is made of chromium, the adhesive layer 14A preferably has a thickness of about 40 nm to about 300 nm, and more preferably about 50 nm to about 150 nm.

The reflective layer 14B is preferably made of, for example, silver or an alloy including silver, because silver has the highest reflectance among metals, so an absorption loss of light in the reflective layer 14B can be reduced. Moreover, the reflective layer 14B made of silver is preferable, because the reflective layer 14B has the highest reflectance; however, the reflective layer 14B made of an alloy including silver and another metal is more preferable, because chemical stability and processing accuracy can be enhanced, and adhesion with the adhesive layer 14A and the barrier layer 14C can be improved. Silver has extremely high reactivity, low processing accuracy and low adhesion, so it is extremely difficult to handle silver.

Examples of the alloy including silver of the reflective layer 14B include alloys including silver (Ag) and at least one element, such as neodymium (Nd), samarium (Sm), yttrium (Y), cerium (Ce), europium (Eu), gadolinium (Gd), terbium (Tb), dysprosium (Dy), erbium (Er), ytterbium (Yb), scandium (Sc), ruthenium (Ru), copper (Cu), gold (Au) and combinations thereof. More specifically, a AgSmCu alloy including silver (Ag), samarium (Sm) and copper (Cu) is cited, and an alloy including silver (Ag) as a main component, 0.03% by mass to 0.5% by mass inclusive of samarium (Sm) and 0.2% by mass to 1.0% by mass inclusive of copper (Cu) is preferable. Moreover, an alloy including silver (Ag) as a main component, 0.05% by mass to 0.2% by mass inclusive of samarium (Sm) and 0.2% by mass to 1.0% by mass inclusive of copper (Cu) is more preferable.

The thickness of the reflective layer 14B is preferably within a range of, for example, about 50 nm to about 300 nm inclusive. It is because when the thickness is within the range, adhesion can be secured, thereby the separation of the first electrode 14 can be prevented. Further, the thickness of the reflective layer 14B is more preferably within a range of about 50 nm to about 150 nm inclusive. It is because when the thickness of the reflective layer 14B is reduced, the surface roughness of the reflective layer 14B can be reduced, thereby the thickness of the barrier layer 14C can be reduced to increase light extraction efficiency. Moreover, it is because when the thickness of the reflective layer 14B is reduced, an increase in the surface roughness due to crystallization of the reflective layer 14B by heat processing during manufacturing can be reduced, thereby an increase in defects of the barrier layer 14C due to the increased surface roughness of the reflective layer 14B can be prevented.

The barrier layer 14C has functions of preventing silver or an alloy including silver of the reflective layer 14B from reacting with oxygen or sulfur in air, and reducing damage on the reflective layer 14B during a manufacturing step after forming the reflective layer 14B. More specifically, it is considered that the damage herein is caused by a chemical solution or the like used to form an aperture portion 15A of the insulating film 15 which will be described later. Further, the barrier layer 14C also has a function as a work function adjustment layer which enhances efficiency of hole injection into the organic layer 16, so the barrier layer 14C is preferably made of a material having a higher work function than the reflective layer 14B.

The barrier layer 14C is preferably a light transparent film made of, for example, a metal, an oxide or a metal compound including a metal element such as indium (In), tin (Sn), zinc (Zn), cadmium (Cd), titanium (Ti), chromium (Cr), gallium (Ga) aluminum (Al), the like and combinations thereof. More specifically, the barrier layer 14C is preferably made of at least one type of a compound including indium (In), tin (Sn), oxygen (O), indium tin oxide (ITO), a compound including indium (In), zinc (Zn) and oxygen (O), such as indium zinc oxide (IZO), indium oxide ($In_2O_3$), tin oxide ($SnO_2$), zinc oxide (ZnO), cadmium oxide (CdO), titanium oxide ($TiO_2$), chromium oxide ($CrO_2$), gallium nitride (GaN), gallium oxide ($Ga_2O_3$), aluminum oxide ($Al_2O_3$), the like and combinations thereof. It is because compared to the case where the barrier layer 14C is made of a metallic material, by using any of these inorganic light-transparent materials, the barrier layer 14C can be formed so as to have a smaller surface roughness, so the surface roughness of the reflective layer 14B made of silver or an alloy including silver can be reduced to improve the surface planarization of the first electrode 14. Moreover, it is because each layer of the organic layer 16 formed on the first electrode 14 can have a uniform thickness, thereby a possibility of a short circuit between the first electrode 14 and the second electrode 17 due to the lack of thickness of the organic layer 16 can be eliminated, and specifically when a resonator structure which will be described later is formed, the occurrence of color unevenness in pixels can be prevented to enhance color reproducibility. Further, it is because the materials have extremely small light absorption in a visible light range, and good light transmittance, so an absorption loss when light generated in the light-emitting layer passes through the barrier layer 14C can be minimized.

In order for the barrier layer 14C to secure the above-described function as a protective film, the thickness of the barrier layer 14C is preferably within a range of about 1 nm to about 50 nm inclusive, and more preferably about 3 nm to about 30 nm inclusive.

The insulating film 15 is used to secure insulation between the first electrode 14 and the second electrode 17, and to accurately form a desired shape of a light-emitting region in each of the organic light-emitting devices 10R, 10G and 10B. The insulating film 15 has, for example, a thickness of approximately about 600 nm, and is made of an insulating material, such as silicon dioxide ($SiO_2$), a polyimide and/or the like. In the insulating film 15, an aperture portion 15A is disposed corresponding to a light-emitting region.

Figure 2:
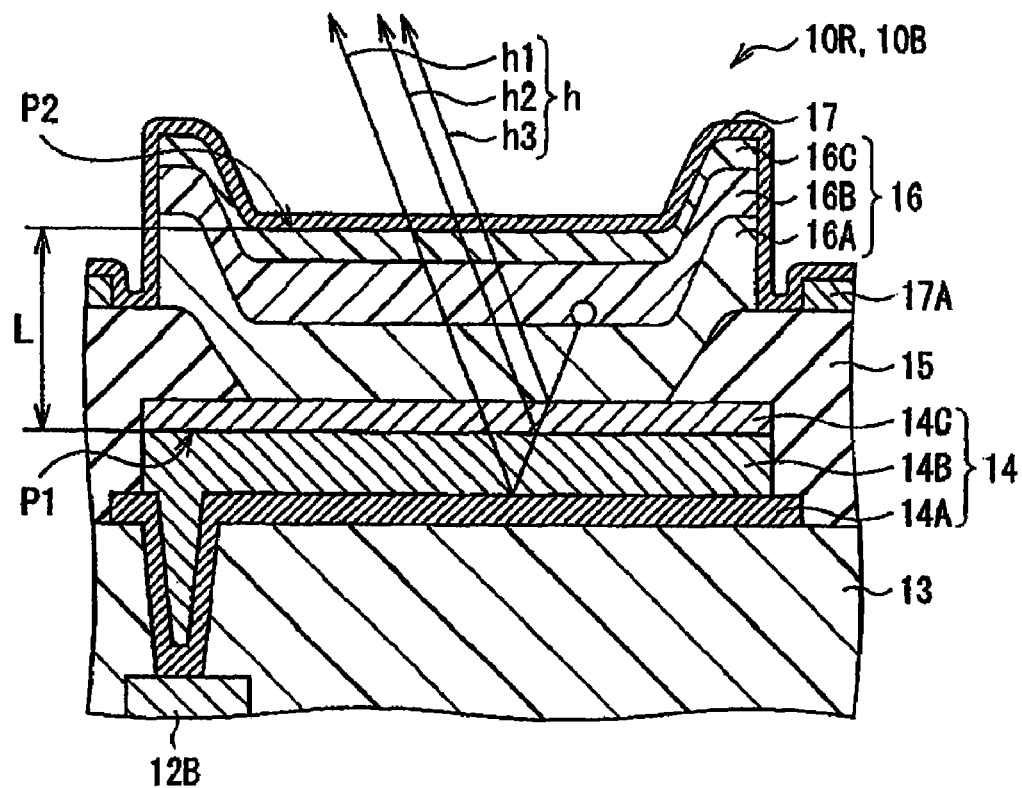
FIG. 2 is an enlarged sectional view of an organic light-emitting device shown in FIG. 1.

The organic layer 16 has a different structure depending upon colors emitted from the organic light-emitting devices 10R, 10G and 10B. FIG. 2 shows an enlarged view of the organic layer 16 in the organic light-emitting devices 10R and 10B. The organic layer 16 of each of the organic light-emitting devices 10R and 10B has a structure in which a hole transport layer 16A, a light-emitting layer 16B and an electron transport layer 16C are laminated in this order from the first electrode 14. The hole transport layer 16A enhances the efficiency of hole injection into the light-emitting layer 16B. In the embodiment, the hole transport layer 16A also serves as a hole injection layer. The light-emitting layer 16C generates light through applying an electric field to recombine electrons and holes, and emits the light in a region corresponding to the aperture portion 15A of the insulating film 15. The electron transport layer 16C enhances the efficiency of electron injection into the light-emitting layer 16B.

The hole transport layer 16A of the organic light-emitting device 10R has, for example, a thickness of approximately 45 nm, and made of bis[(N-naphthyl)-N-phenyl]benzidine (α-NPD) and the like. The light-emitting layer 16B of the organic light-emitting device 10R has, for example, a thickness of approximately 50 nm, and is made of 2,5-bis[4-[N-(4-methoxyphenyl)-N-phenylamino]]styrylbenzene-1,4-dicarbonitrile (BSB) and the like. The electron transport layer 16C of the organic light-emitting device 10R has, for example, a thickness of approximately 30 nm, and is made of 8-quinolinol aluminum complex ($Alq_3$) and the like.

The hole transport layer 16A of the organic light-emitting device 10B has, for example, a thickness of approximately 30 nm, and is made of α-NPD. The light-emitting layer 16B of the organic light-emitting device 10B has, for example, a thickness of approximately 30 nm, and is made of 4,4'-bis(2,2'-diphenyl vinyl)biphenyl (DPVBi) and the like. The electron transport layer 16C of the organic light-emitting device 10B has, for example, a thickness of approximately 30 nm, and is made of $Alq_3$ and the like.

Figure 3:
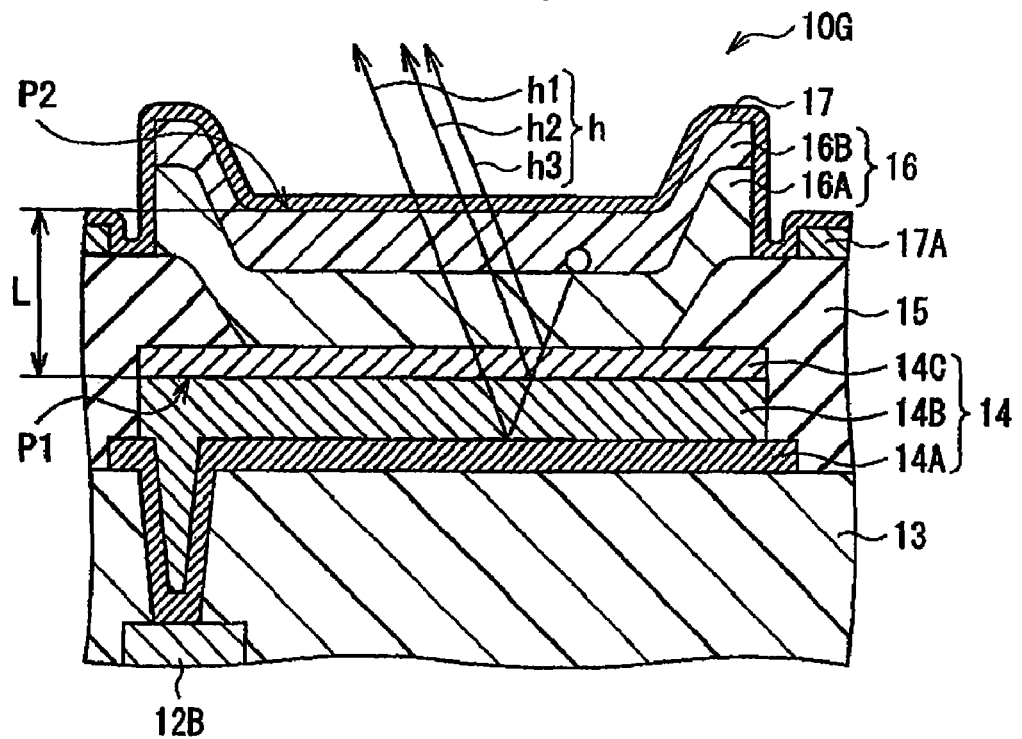
FIG. 3 is an enlarged sectional view of the organic light-emitting device shown in FIG. 1.

FIG. 3 shows an enlarged view of the organic layer 16 in the organic light-emitting device 10G. The organic layer 16 of the organic light-emitting device 10G has a structure in which a hole transport layer 16A and a light-emitting layer 16B are laminated in this order from the first electrode 14. The hole transport layer 16A also serves as a hole injection layer, and the light-emitting layer 16B also serves as an electron transport layer.

The hole transport layer 16A of the organic light-emitting device 10G has, for example, a thickness of approximately 50 nm, and is made of α-NPD and the like. The light-emitting layer 16B of the organic light-emitting device 10G has, for example, a thickness of approximately 60 nm, and is made of $Alq_3$ mixed with 1 vol % of Coumarin6 (C6).

The second electrode 17 shown in FIGS. 1, 2 and 3 has, for example, a thickness of approximately 10 nm, and is made of a metal such as silver (Ag), aluminum (Al), magnesium (Mg), calcium (Ca) or sodium (Na), or an alloy and the like. In the embodiment, for example, the second electrode 17 is made of, for example, an alloy of magnesium (Mg) and silver (MgAg alloy) and the like.

The second electrode 17 is formed so that the organic light-emitting devices 10R, 10G and 10B are covered with the second electrode 17, thereby the second electrode 17 is a common electrode of the organic light-emitting devices 10R, 10G and 10B. An auxiliary electrode 17A is preferably disposed on the insulating film 15 to reduce a voltage drop in the second electrode 17. The auxiliary electrode 17A is disposed in gaps between the organic light-emitting devices 10R, 10G and 10B, and an end portion thereof is connected to a trunk-shaped auxiliary electrode (not shown) which is a bus formed so as to surround a region where the organic light-emitting devices 10R, 10G and 10B are disposed in a peripheral portion of the substrate 11. The auxiliary electrode 17A and the trunk-shaped auxiliary electrode have a single layer structure or a laminate structure made of an electrically conductive material with low resistance such as aluminum (Al) or chromium (Cr).

The second electrode 17 also serves as a semi-transparent reflective layer. More specifically, each of the organic light-emitting devices 10R, 10G and 10B has a resonator structure in which assuming that an end surface of the first electrode 14 on a side closer to the light-emitting layer 16B and an end surface of the second electrode 17 on a side closer to the light-emitting layer 16B are a first end portion P1 and a second end portion P2, respectively, and the organic layer 16 is a resonant portion, light generated in the light-emitting layer 16B is resonated to be extracted from the second end portion P2. The organic light-emitting devices 10R, 10G and 10B preferably have such a resonator structure, because when multiple interference of the light generated in the light-emitting layer 16B occurs, the structure functions as a kind of narrow-band filter, so the half-value width of the spectrum of extracted light can be reduced, and color purity can be improved. Moreover, external light incident from the sealing panel 20 can be attenuated by the multiple interference, and the reflectance of the external light on the organic light-emitting devices 10R, 10G and 10B can become extremely small by a combination of a color filter 22 (refer to FIG. 1) which will be described later.

For the purpose, it is preferable that an optical distance L between the first end portion P1 and the second end portion P2 of the resonator satisfies Mathematical Formula 1 so that a resonant wavelength of the resonator (a peak wavelength of the spectrum of light to be extracted) matches a peak wavelength of the spectrum of light desired to be extracted. Actually, the optical distance L is preferably selected to be a positive minimum value satisfying Mathematical Formula 1.

$$(2L)/\lambda + \Phi/(2\pi) = m \qquad \text{Mathematical Formula 1}$$

where L represents an optical distance between the first end portion P1 and the second end portion P2, $\Phi$ represents the sum of a phase shift $\Phi_1$ of reflected light generated in the first end portion P1 and a phase shift $\Phi_2$ of reflected light generated in the second end portion P2 ($\Phi = \Phi_1 + \Phi_2$) (rad), λ represents a peak wavelength of the spectrum of light desired to be extracted from the second end portion P2, and m is an integer to make L a positive value. Further, in Mathematical Formula 1, the units of L and λ may be the same, for example, nanometers (nm).

Herein, as in the case of the embodiment, when the first electrode 14 has a structure in which the adhesive layer 14A, the reflective layer 14B and the barrier layer 14C are laminated, the position of the first end portion P1 may vary depending upon the material and the thickness of each layer. In principle, as shown in FIGS. 2 and 3, reflected light h of the light generated in the light-emitting layer 16B on the first end portion P1 is a composite wave including reflected light h1 generated in an interface between the adhesive layer 14A and the reflective layer 14B, reflective light h2 generated in an interface between the reflective layer 14B and the barrier layer 14C, and reflected light h3 generated in an interface between the barrier layer 14C and the organic layer 16, and the first end portion P1 is a virtual interface corresponding to the composite wave. However, in the embodiment, the reflective layer 14B is made of silver or an alloy including silver, so when the reflective layer 14B has an enough thickness, the reflected light h1 generated in the interface between the adhesive layer 14A and the reflective layer 14B is small. Moreover, when the barrier layer 14C is made of the above-described material, the reflected light h3 generated in the interface between the barrier layer 14C and the organic layer 16 is also small, so it can be considered that the barrier layer 14C is included in a resonant portion, and the first end portion P1 is an interface between the reflective layer 14B and the barrier layer 14C.

The protective film 18 shown in FIG. 1 has, for example, a thickness of about 500 nm to about 10000 nm inclusive, and is a passivation film made of a transparent dielectric. The protective film 18 is made of, for example, silicon oxide (SiO₂), silicon nitride (SiN) or the like.

As shown in FIG. 1, the sealing panel 20 is placed on a side of the drive panel 10 closer to the second electrode 17, and has a sealing substrate 21 which seals the organic light-emitting devices 10R, 10G and 10B with the adhesive layer 30. The sealing substrate 21 is made of a material transparent to light generated in the organic light-emitting devices 10R, 10G and 10B such as glass or the like. For example, the color filter 22 is disposed on the sealing substrate 21 to extract light generated in the organic light-emitting devices 10R, 10G and 10B, and to absorb external light reflected by the organic light-emitting devices 10R, 10G and 10B and wirings therebetween, thereby the contrast is improved.

The color filter 22 may be disposed on either side of the sealing substrate 21, but the color filter 22 is preferably disposed on a side closer to the drive panel 10, because the color filter 22 is not exposed to the surface, and can be protected by the adhesive layer 30. The color filter 22 includes a red filter 22R, a green filter 22G and a blue filter 22B, which are disposed corresponding to the organic light-emitting devices 10R, 10G and 10B, respectively.

The red filter 22R, the green filter 22G and the blue filter 22B each have, for example, a rectangular shape, and are formed with no space in between. The red filter 22R, the green filter 22G and the blue filter 22B each are made of a resin mixed with pigments, and by the selection of the pigments, the light transmittance in a targeted wavelength of red, green or blue is adjusted to be higher, and the light transmittance in other wavelengths is adjusted to be lower.

Moreover, a wavelength range with high transmittance in the color filter 22 matches the peak wavelength λ of the spectrum of light desired to be extracted from the resonator structure. Thereby, among external light incident from the sealing panel 20, only light having a wavelength equivalent to the peak wavelength λ of the spectrum of light to be extracted passes through the color filter 22, and external light with other wavelengths can be prevented from entering into the organic light-emitting devices 10R, 10G and 10B.

The display unit can be manufactured through, for example, the following steps.

FIGS. 4A through 13 show steps in a method of manufacturing the display unit in order. At first, as shown in FIG. 4A, the TFT 12, the interlayer insulating film 12A and the wiring 12B are formed on the substrate 11 made of the above-described material.

Next, as shown in FIG. 4B, the planarizing layer 13 made of the above-described material is formed throughout the substrate by, for example, a spin coat method, and then while the planarizing layer 13 is patterned in a predetermined shape by exposure and development, the connecting hole 13A is formed. After that, in order to imidize polyimide, polyimide is baked at, for example, 320° C. with a clean baking furnace.

Figures 5A, 5B, 5C:
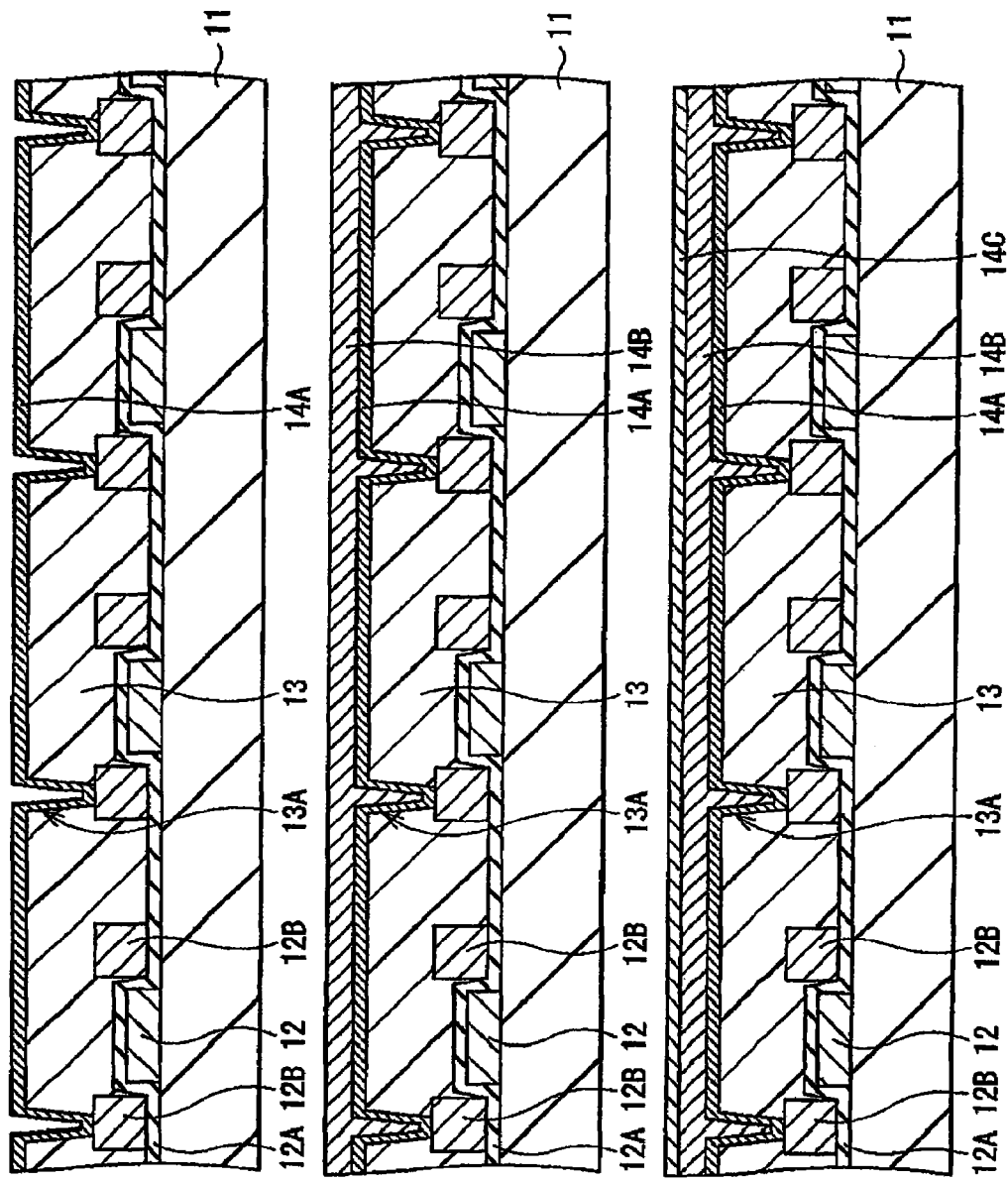
FIGS. 5A, 5B and 5C are sectional views for showing steps following the steps in FIGS. 4A and 4B.

Next, as shown in FIG. 5A, the adhesive layer 14A made of, for example, chromium (Cr) with a thickness of about 80 nm is formed on the planarizing layer 13 by, for example, sputtering.

After that, as shown in FIG. 5B, the reflective layer 14B made of, for example, an alloy including silver with a thickness of about 150 nm is formed on the adhesive layer 14A by, for example, sputtering. Thus, the reflective layer 14B is formed on the planarizing layer 13 with the adhesive layer 14A in between, thereby the reflective layer 14B can be prevented from being separated from the planarizing layer 13 as a base layer. Moreover, the entry of an etching solution or air from a separated portion of the reflective layer 14 can be prevented, thereby silver or an alloy including silver of the reflective layer 14B can be prevented from reacting with oxygen or sulfur included in the etching solution or the air.

Next, as shown in FIG. 5C, the barrier layer 14C made of, for example, ITO with a thickness of 15 nm is formed on the reflective layer 14B by, for example, sputtering. Thus, after forming the reflective layer 14B, the barrier layer 14C is immediately formed, thereby silver or the alloy including silver of the reflective layer 14B can be prevented from reacting with oxygen or sulfur in air, and during a manufacturing step after forming the reflective layer 14B, damage on the reflective layer 14B can be reduced, and an interface between the reflective layer 14B and the barrier layer 14C can be maintained clean.

Figure 6A:
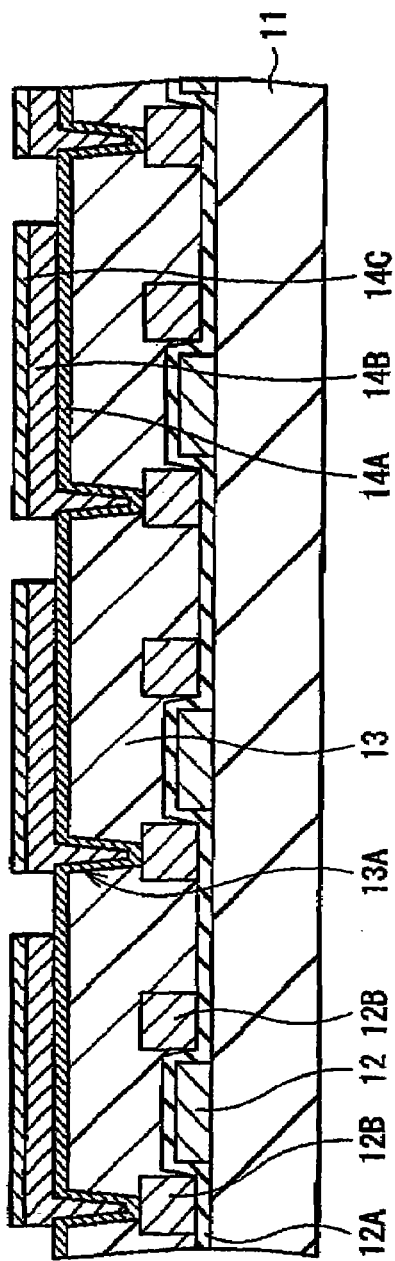
FIGS. 6A and 6B are sectional views for showing steps following the steps in FIGS. 5A through 5C.

After forming the adhesive layer 14A, the reflective layer 14B and the barrier layer 14C, as shown in FIG. 6A, the barrier layer 14C and the reflective layer 14B are selectively etched by, for example, lithography or wet etching to be patterned in a predetermined shape.

Figure 6B:
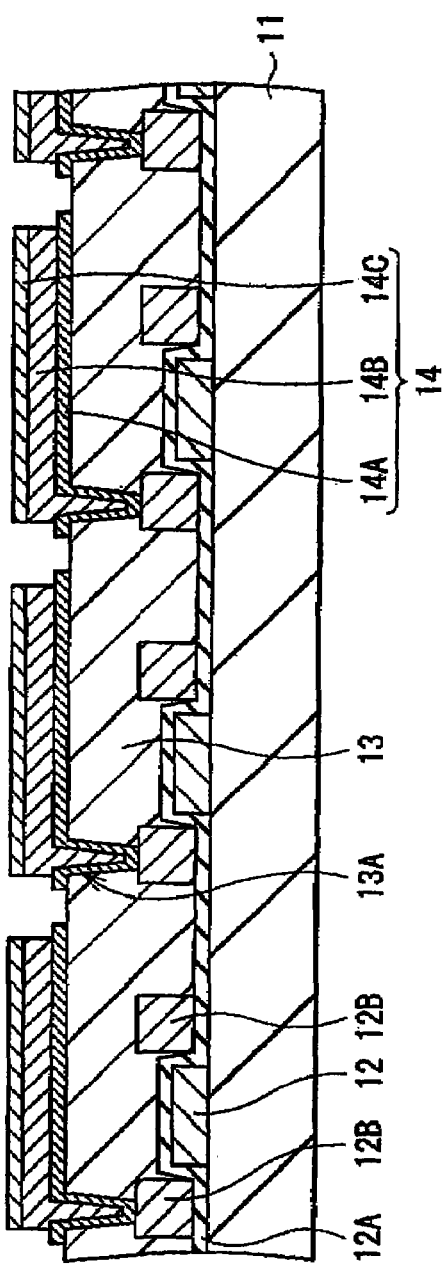

Next, as shown in FIG. 6B, the adhesive layer 14A is patterned by, for example, lithography or wet etching to form the first electrode 14. At this time, a sidewall of the reflective layer 14B is preferably covered with a photoresist, because the possibility that the sidewall of the reflective layer 14B contacts a chemical solution for wet etching can be eliminated, thereby damage on the reflective layer 14B can be reduced.

After that, as shown in FIG. 7A, the insulating film 15 with the above-described thickness is formed throughout the substrate 11 by, for example, CVD (chemical vapor deposition), and a portion of the insulating film 15 corresponding to the light-emitting region is selectively removed by, for example, lithography to form the aperture portion 15A.

Next, as shown in FIG. 7B, the auxiliary electrode 17A is formed on the insulating film 15 throughout the substrate 11, and then is selectively etched by, for example, lithography to be patterned in a predetermined shape.

Figure 8:
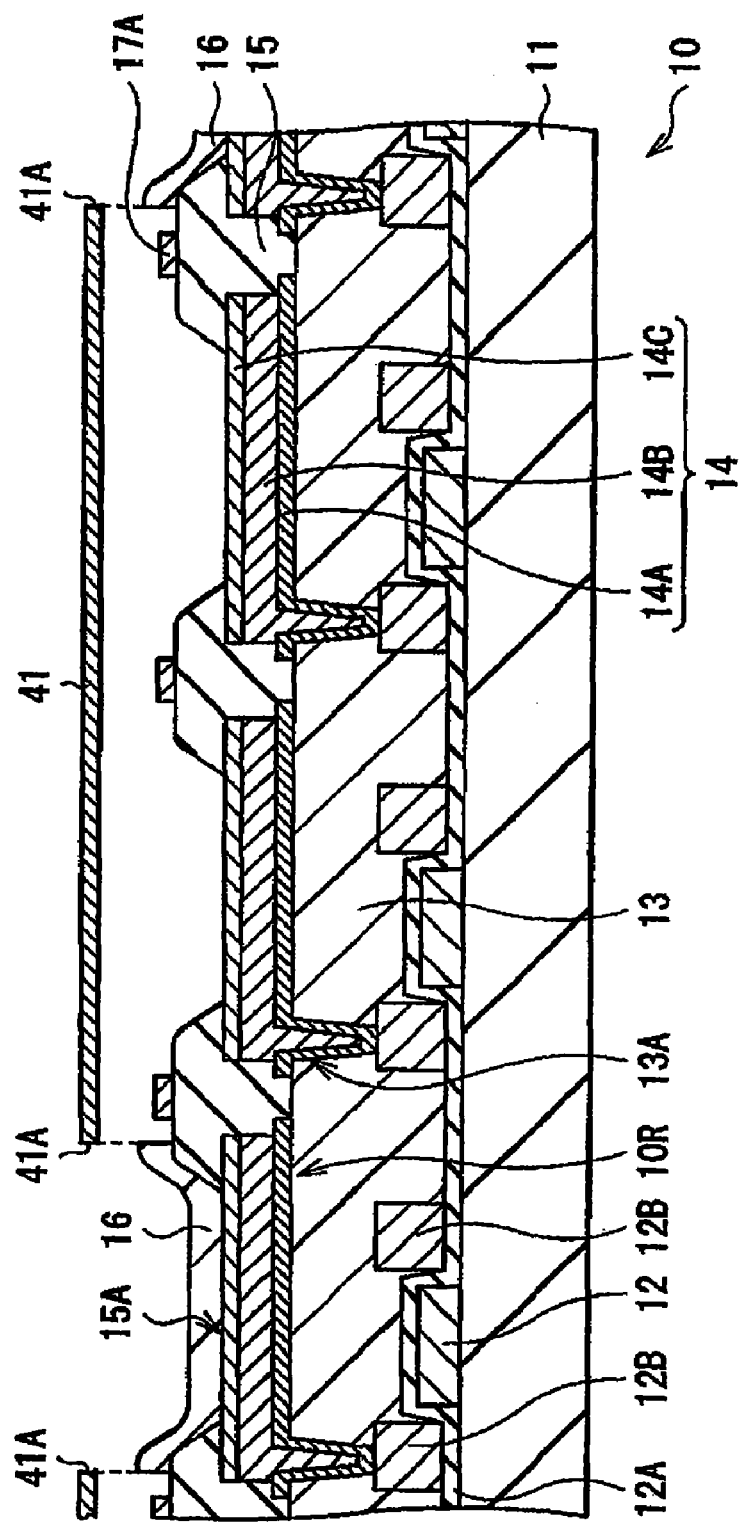
FIG. 8 is a sectional view for showing a step following the steps in FIGS. 7A and 7B.

Next, as shown in FIG. 8, the hole transport layer 16A, the light-emitting layer 16B and the electron transport layer 16C of the organic light-emitting device 10R all of which are made of the above-described materials with the above-described thicknesses are formed by, for example, vapor deposition to form the organic layer 16 of the organic light-emitting device 10R. At this time, it is preferable that a metallic mask 41 having an aperture 41A corresponding to a region where the organic layer 16 is formed is used to form the organic layer 16 corresponding to the light-emitting region, that is, the aperture portion 15A of the insulating film 15. However, it is difficult to deposit the organic layer 16 only in the aperture portion 15A with high accuracy, so the whole aperture portion 15A may be covered with the organic layer 16 so as to lay the organic layer 16 on an edge of the insulating film 15.

Figure 9:
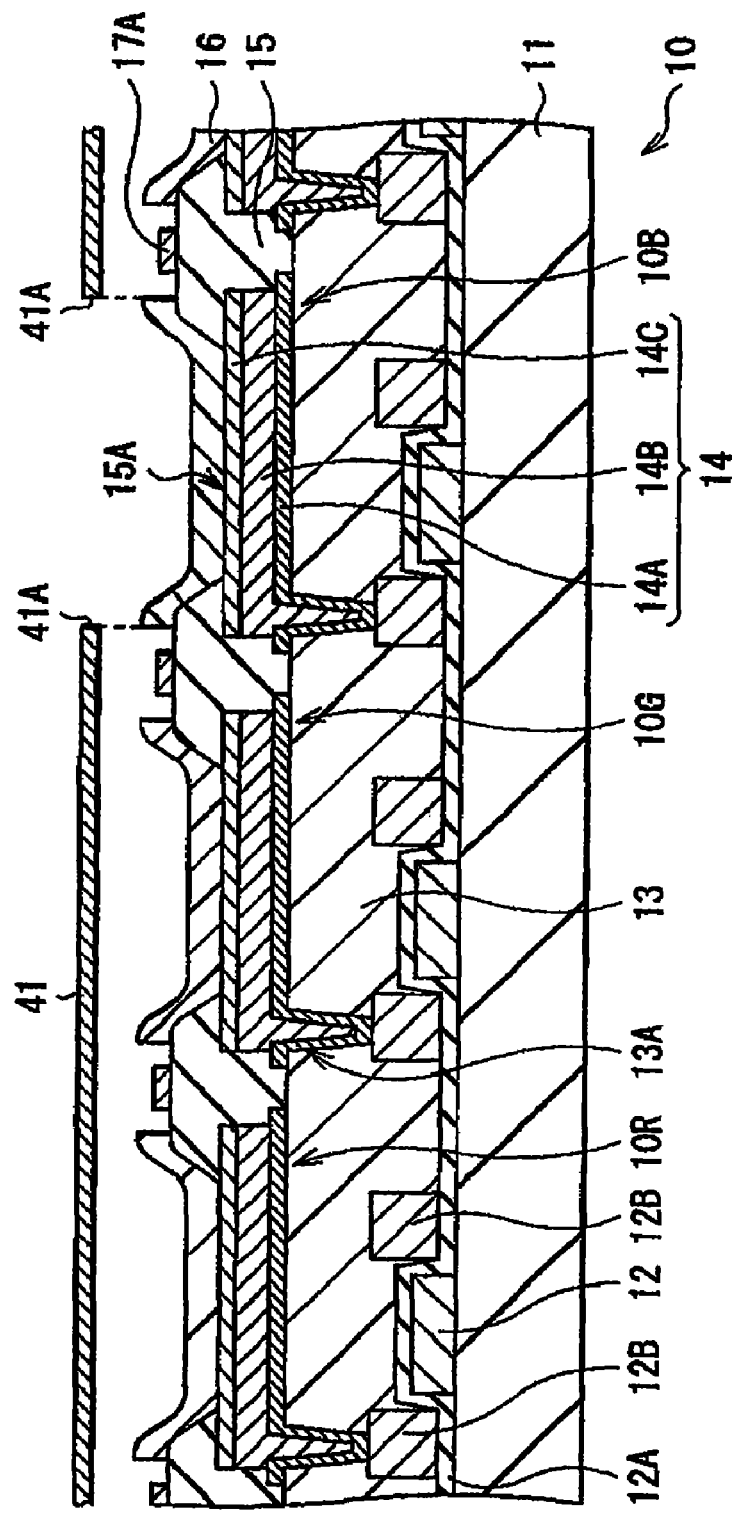
FIG. 9 is a sectional view for showing a step following the step in FIG. 8.

After that, the mask 41 is shifted, and as shown in FIG. 9, as in the case of the organic layer 16 of the organic light-emitting device 10R, the hole transport layer 16A and the light-emitting layer 16B of the organic light-emitting device 10G both made of the above-described materials with the above-described thicknesses are formed so as to form the organic layer 16 of the organic light-emitting device 10G. Next, the mask 41 is shifted again, and as shown in FIG. 9, as in the case of the organic layer 16 of the organic light-emitting device 10R, the hole transport layer 16A, the light-emitting layer 16B and the electron transport layer 16C of the organic light-emitting device 10B all of which are made of the above-described materials with the above-described thicknesses are formed so as to form the organic layer 16 of the organic light-emitting device 10B. FIG. 9 shows a state in which the aperture 41A of the mask 41 faces the organic layer 16 of the organic light-emitting device 10B.

Figure 10:
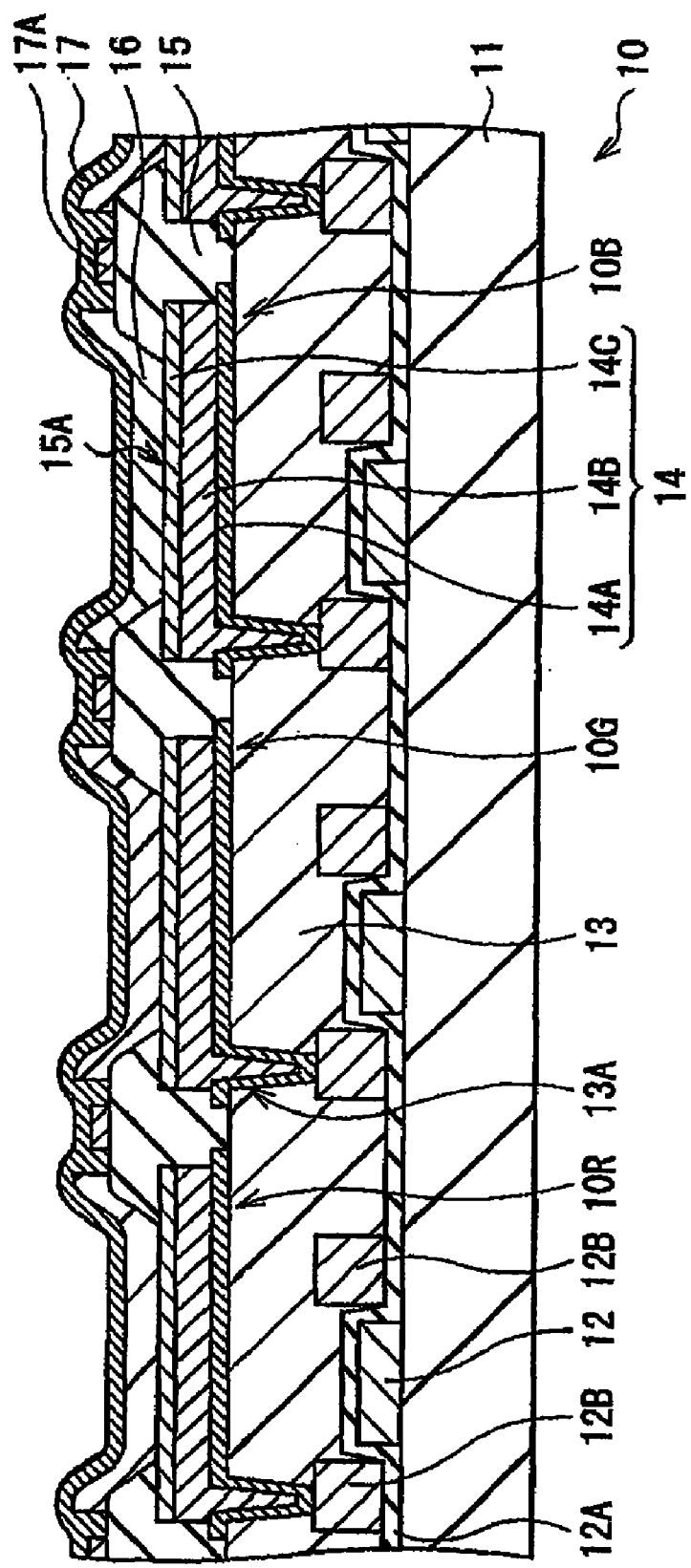
FIG. 10 is a sectional view for showing a step following the step in FIG. 9.

After forming the organic layer 16 of each of the organic light-emitting devices 10R, 10G and 10B, as shown in FIG. 10, the second electrode 17 made of the above-described material with the above-described thickness is formed throughout the substrate 11 by, for example, vapor deposition. Thereby, the second electrode 17 is electrically connected to the auxiliary electrode 17A which has already been formed and the trunk-shaped auxiliary electrode (not shown) as a bus. Thus, the organic light-emitting devices 10R, 10G and 10B shown in FIGS. 1 through 3 are formed.

Figure 11:
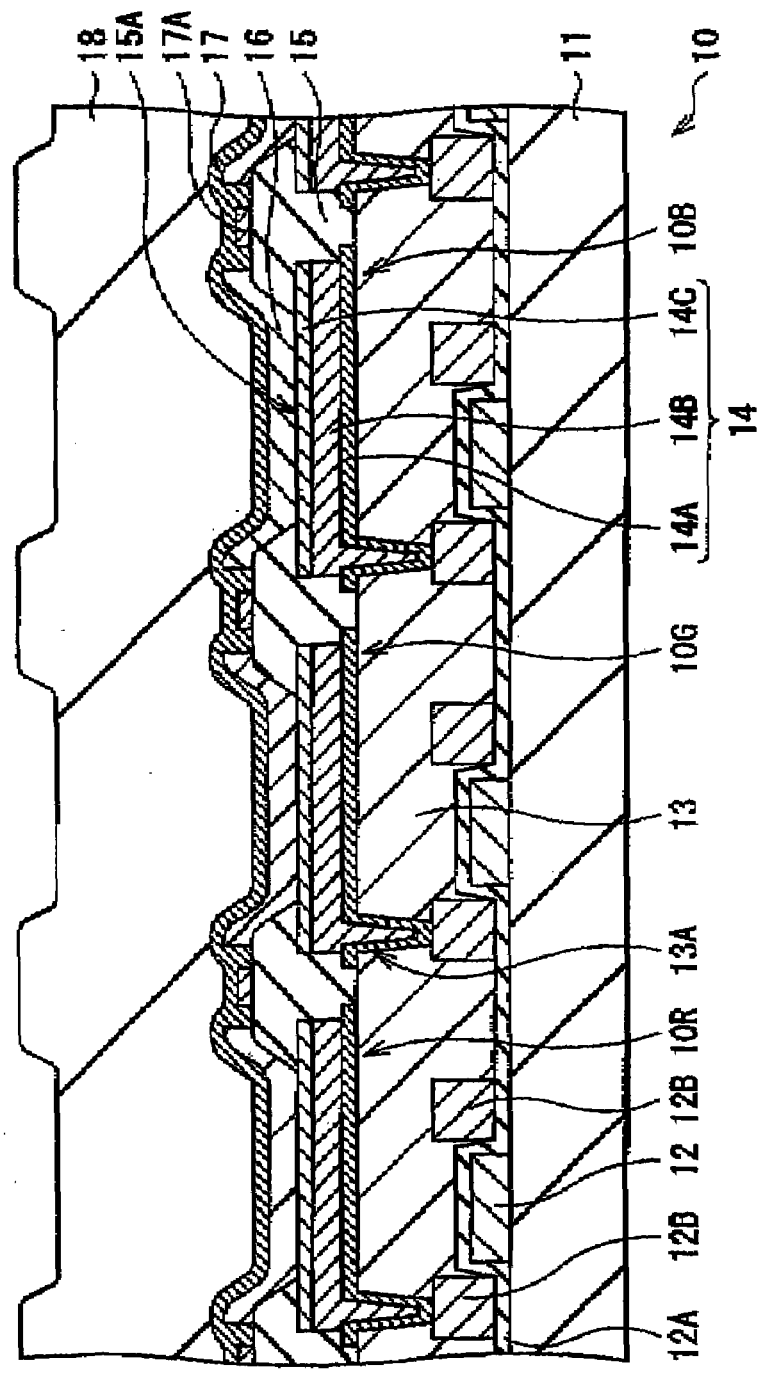
FIG. 11 is a sectional view for showing a step following the step in FIG. 10.

Next, as shown in FIG. 11, the protective film 18 made of the above-described material with the above-described thickness is formed on the second electrode 17. Thereby, the drive panel 10 shown in FIG. 1 is formed.

Figure 12A:
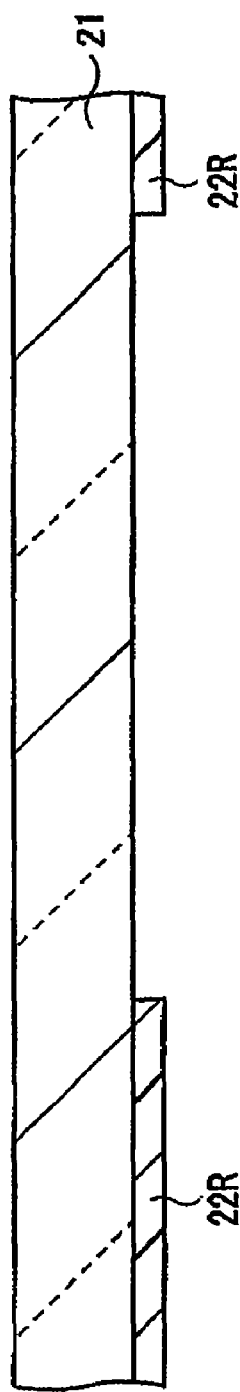
FIGS. 12A and 12B are sectional views for showing steps following the step in FIG. 11.
Figure 12B:
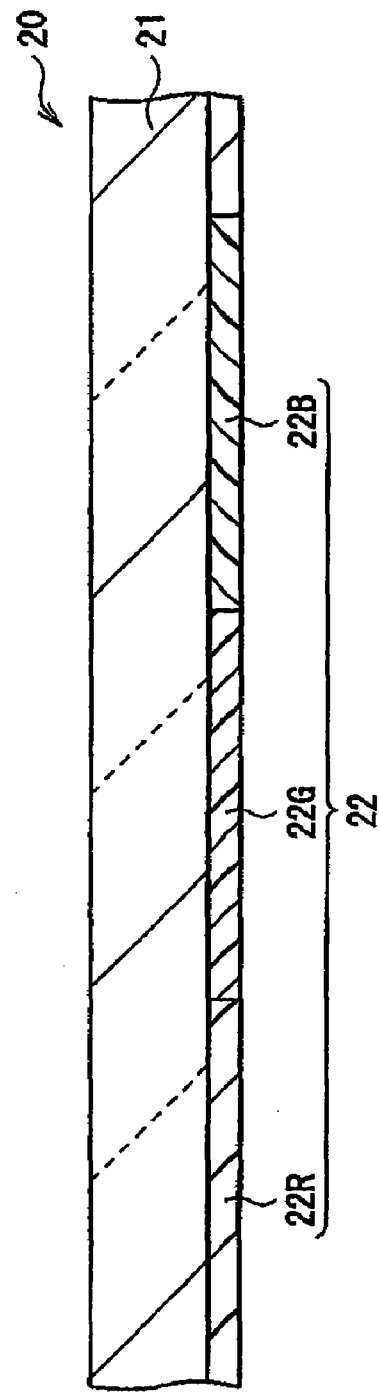

Moreover, as shown in FIG. 12A, the sealing substrate 21 made of the above-described material is coated with the material of the red filter 22R by spin coating or the like, and then the material of the red filter 22R is patterned by photolithography, and is baked so as to form the red filter 22R. Next, as shown in FIG. 12B, as in the case of the red filter 22R, the blue filter 22B and the green filter 22G are formed in order. Thereby, the sealing panel 20 is formed.

Figure 13:
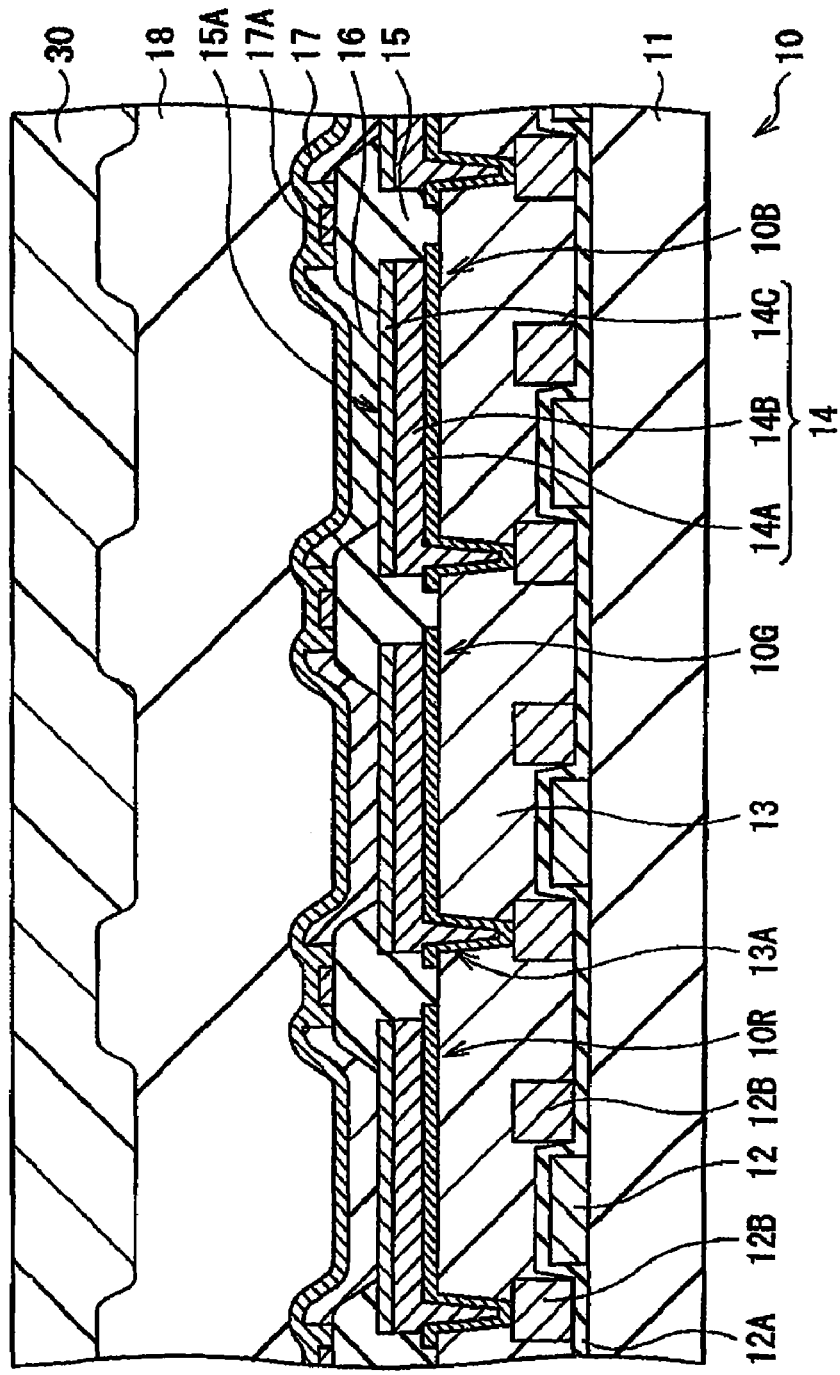
FIG. 13 is a sectional view for showing a step following the steps in FIGS. 12A and 12B.

After forming the sealing panel 20 and the drive panel 10, as shown in FIG. 13, the adhesive layer 30 made of a thermosetting resin is formed through coating on a side of the substrate 11 where the organic light-emitting devices 10R, 10G and 100B are formed. The coating may be carried out through emitting the resin from a slit nozzle dispenser, or through roll coating or screen printing. Next, as shown in FIG. 1, the drive panel 10 and the sealing panel 20 are bonded together with the adhesive layer 30 in between. At this time, a surface of the sealing panel 20 where the color filter 22 is formed preferably faces the drive panel 10. Moreover, it is preferable to avoid air bubbles from entering into the adhesive layer 30. After that, relative positioning between the color filter 22 of the sealing panel 20 and the organic light-emitting devices 10R, 10G and 10B of the drive panel 10 is aligned, then heat treatment is carried out at a predetermined temperature for a predetermined time to cure the thermosetting resin of the adhesive layer 30. Thereby, the display unit shown in FIGS. 1 through 3 is completed.

In the display unit, when a predetermined voltage is applied between the first electrode 14 and the second electrode 17, a current is injected into the light-emitting layer 16B of the organic layer 16, and holes and electrons are recombined to emit light mainly from an interface of the light-emitting layer 16B on a side closer to the hole transport layer 16A. The light is reflected several times between the first end portion P1 and the second end portion P2, and then passes through the second electrode 17 to be extracted. In the embodiment, the first electrode 14 has a structure in which the adhesive layer 14A, the reflective layer 14B and the barrier layer 14C are laminated, so alteration of the reflective layer 14B can be prevented by the barrier layer 14C, and the reflective layer 14B can be prevented from being separated from the planarizing layer 13 by the adhesive layer 14A.

Thus, in the embodiment, the first electrode 14 has a structure in which the adhesive layer 14A, the reflective layer 14B and the barrier layer 14C are laminated, so separation or alteration of the reflective layer 14B can be prevented, thereby the occurrence of a short circuit between the first electrode 14 and the second electrode 17 due to the alteration of the reflective layer 14B can be prevented. Therefore, the embodiment is specifically suitable when the reflective layer 14B is made of silver (Ag) or an alloy including silver, and in the embodiment, defects in the display unit can be reduced, and the life of the display unit can be extended.

Moreover, in the embodiment, after the adhesive layer 14A, the reflective layer 14B and the barrier layer 14C are formed on the planarizing layer 13 as a base layer, they are patterned in order from the barrier layer 14C to form the first electrode 14, so silver or the alloy including silver of the reflective layer 14B can be prevented from reacting with oxygen or sulfur in air by the barrier layer 14C, and damage on the reflective layer 14B during a manufacturing step after forming the reflective layer 14B can be reduced. Further, the reflective layer 14B can be prevented from being separated from the planarizing layer 13 by the adhesive layer 14A, thereby an adverse effect on the reflective layer 14B by air or a chemical solution entered into a separated portion of the reflective layer 14B can be prevented.

Figure 14:
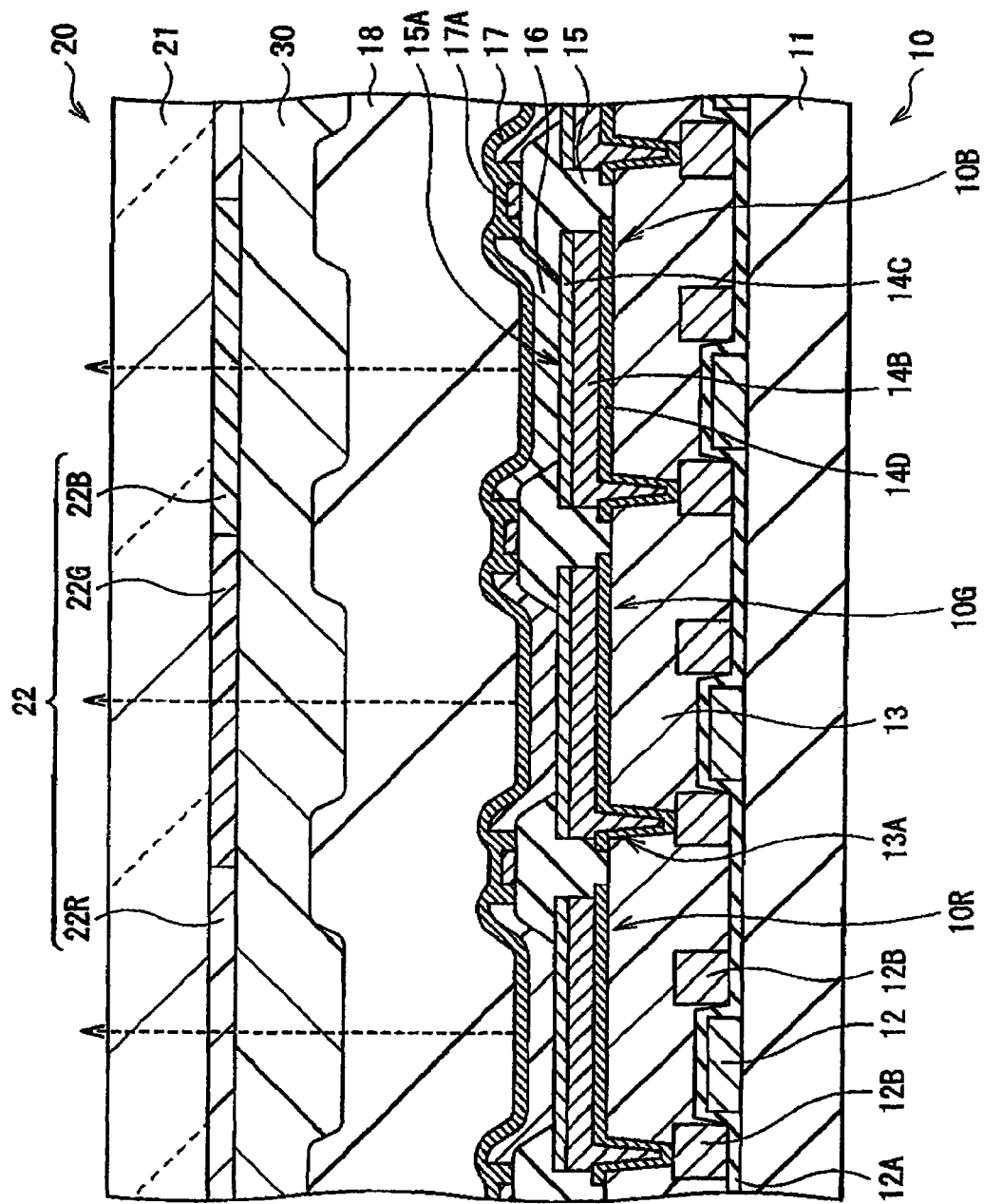
FIG. 14 is a sectional view of a display unit according to a second embodiment of the invention.

FIG. 14 shows a sectional view of a display unit according to a second embodiment of the invention. The display unit is equivalent to the display unit according to the first embodiment, except that instead of the adhesive layer 14A of the first electrode 14, the display unit comprises an adhesive layer-cum-auxiliary reflective film 14D which also has a function as a auxiliary reflective film reflecting light generated in the light-emitting layer 16B and passing through the reflective layer 14B. Therefore, like components are denoted by like numerals as of the first embodiment and will not be further explained.

The adhesive layer-cum-auxiliary reflective film 14D is preferably made of, for example, a metal, an electrically conductive oxide or a metal compound including at least one kind of metal elements, such as chromium (Cr), indium (In), tin (Sn), zinc (Zn), cadmium (Cd), titanium (Ti), aluminum (Al), magnesium (Mg) molybdenum (Mo) and the like, because these materials have high electrical conductivity, so a good electrical connection to the wiring 12B can be established. Moreover, in terms of reflectance, they have small absorption in a visible light range, so high effects as an auxiliary reflective film can be obtained. Further, the adhesive layer-cum-auxiliary reflective film 14D preferably has a reflectance of 50% or over, because higher effects can be obtained. In the embodiment, the adhesive layer-cum-auxiliary reflective film 14D is made of, for example, chromium (with a reflectance of approximately 70% in a wavelength range of about 400 nm to about 500 nm, and approximately 66% in a wavelength range of about 600 nm to about 800 nm as a larger wavelength causes a reduction in the reflectance).

As in the case of the adhesive layer 14A in the first embodiment, the adhesive layer-cum-auxiliary reflective film 14D preferably has as large a thickness as light does not pass therethrough. More specifically, when the adhesive layer-cum-auxiliary reflective film 14D is made of chromium, the thickness thereof is preferably within a range of about 40 nm to about 300 nm inclusive, and more preferably within a range of about 50 nm to about 150 nm inclusive.

As in the case of the first embodiment, the reflective layer 14B is preferably made of, for example, silver or an alloy including silver. The reflective layer 14B preferably has, for example, a thickness of about 10 nm to about 150 nm inclusive. It is because when the thickness is within the range, a reflectance equivalent to that in the first embodiment can be obtained by a synergistic effect with the adhesive layer-cum-auxiliary reflective film 14D. Moreover, the thickness of the reflective layer 14B is more preferably within a range of about 10 nm to about 100 nm inclusive. It is because when the thickness of the reflective layer 14B is reduced, its surface roughness can be reduced, thereby the thickness of the barrier layer 14C can be reduced to further increase light extraction efficiency. Moreover, it is because when the thickness of the reflective layer 14B is reduced, an increase in the surface roughness due to crystallization of the reflective layer 14B by heat processing during manufacturing can be reduced, thereby an increase in defects of the barrier layer 14C due to the increased surface roughness of the reflective layer 14B can be prevented more effectively.

As in the case of the first embodiment, the barrier layer 14C is preferably made of an inorganic transparent material, and more specifically, the barrier layer 14C is preferably made of at least one kind selected from the group consisting of a compound including indium (In), tin (Sn) and oxygen (O), indium tin oxide (ITO), a compound including indium (In), zinc (Zn) and oxygen (O), indium zinc oxide (IZO), tin oxide ($SnO_2$), zinc oxide (ZnO), cadmium oxide (CdO), titanium oxide ($TiO_2$) chromium oxide ($CrO_2$) and the like.

The barrier layer 14C preferably has, for example, a thickness of about 1 nm to about 50 nm inclusive, and more preferably about 3 nm to about 15 nm inclusive. It is because in the embodiment, as described above, the thickness of the reflective layer 14B can be reduced, so even if the thickness of the barrier layer 14C is reduced to the above range, a function as a protective film can be secured. Moreover, it is because when the thickness of the barrier layer 14C is reduced, a loss in light absorption can be reduced to further enhance light extraction efficiency.

Figure 15:
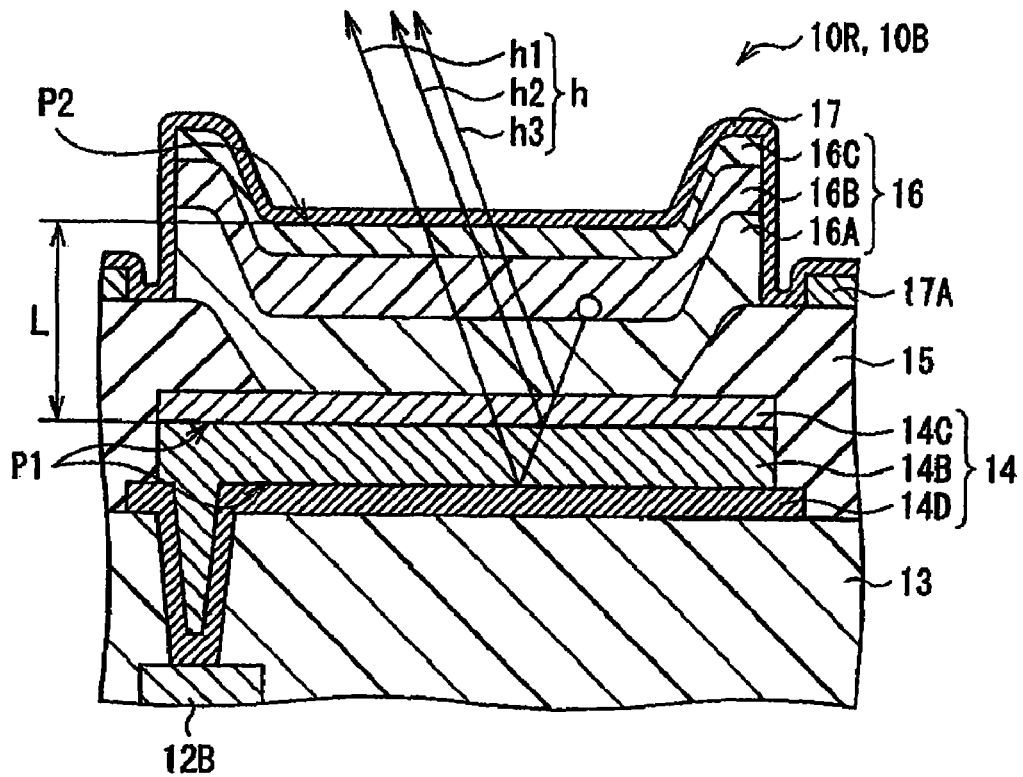
FIG. 15 is an enlarged sectional view of an organic light-emitting device shown in FIG. 14.
Figure 16:
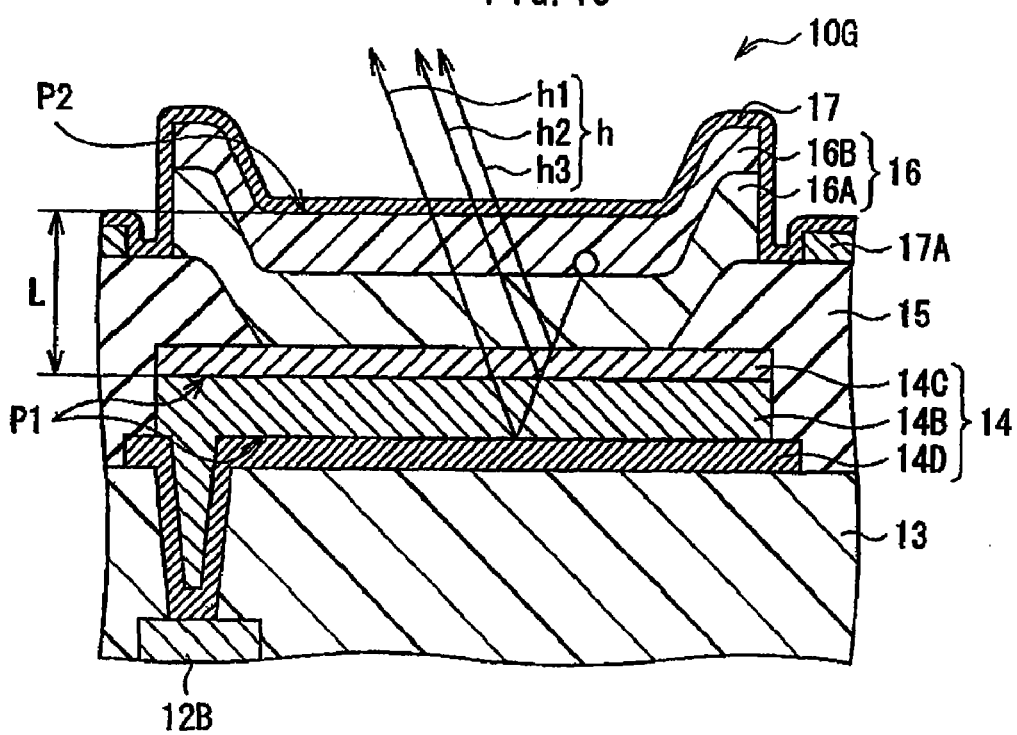
FIG. 16 is an enlarged sectional view of the organic light-emitting device shown in FIG. 14.

When the first electrode 14 has a structure in which the adhesive layer-cum-auxiliary reflective film 14D, the reflective layer 14B and the barrier layer 14C are laminated according to the embodiment, as described above, the thickness of the reflective layer 14B can be thinner than that in the first embodiment. In this case, reflected light h2 generated in an interface between the reflective layer 14B and the barrier layer 14C is smaller than that in the first embodiment, and reflected light h1 generated in an interface between the adhesive layer-cum-auxiliary reflective film 14D and the reflective layer 14B is larger than that in the first embodiment. Therefore, as shown in FIGS. 15 and 16, it can be considered that the first end portion P1 includes an interface between the reflective layer 14B and the barrier layer 14C and an interface between the adhesive layer-cum-auxiliary reflective film 14D and the reflective layer 14B. Reflected light h3 generated in an interface between the barrier layer 14C and the organic layer 16 is as small as that in the first embodiment, so the barrier layer 14C is included in the resonant portion.

The display unit can be manufactured as in the case of the first embodiment.

In the display unit, when a predetermined voltage is applied between the first electrode 14 and the second electrode 17, a current is injected into the light-emitting layer 16B of the organic layer 16, and holes and electrons are recombined to emit light mainly from an interface of the light-emitting layer 16B on a side closer to the hole transport layer 16A. The light is reflected several times between the first end portion P1 and the second end portion P2, and then passes through the second electrode 17 to be extracted. In the embodiment, the first electrode 14 has a structure in which the adhesive layer-cum-auxiliary reflective film 14D, the reflective layer 14B and the barrier layer 14C are laminated, so light generated in the light-emitting layer 16B and having passed through the barrier layer 14C and the reflective layer 14B is reflected by the adhesive layer-cum-auxiliary reflective film 14D. Therefore, even if the reflective layer 14B has a thinner thickness, high reflectance can be maintained.

Thus, in the embodiment, the first electrode 14 has a structure in which the adhesive layer-cum-auxiliary reflective film 14D, the reflective layer 14B and the barrier layer 14C are laminated, so even if the reflective layer 14B has a thinner thickness, a decline in the reflectance of the reflective layer 14B can be prevented by the adhesive layer-cum-auxiliary reflective film 14D to obtain high reflectance. Moreover, when the thickness of the reflective layer 14B is reduced, the thickness of the barrier layer 14C can be also reduced, thereby light extraction efficiency can be improved.

Examples of the present invention are described below without limitation.

EXAMPLE 1

Figure 17:
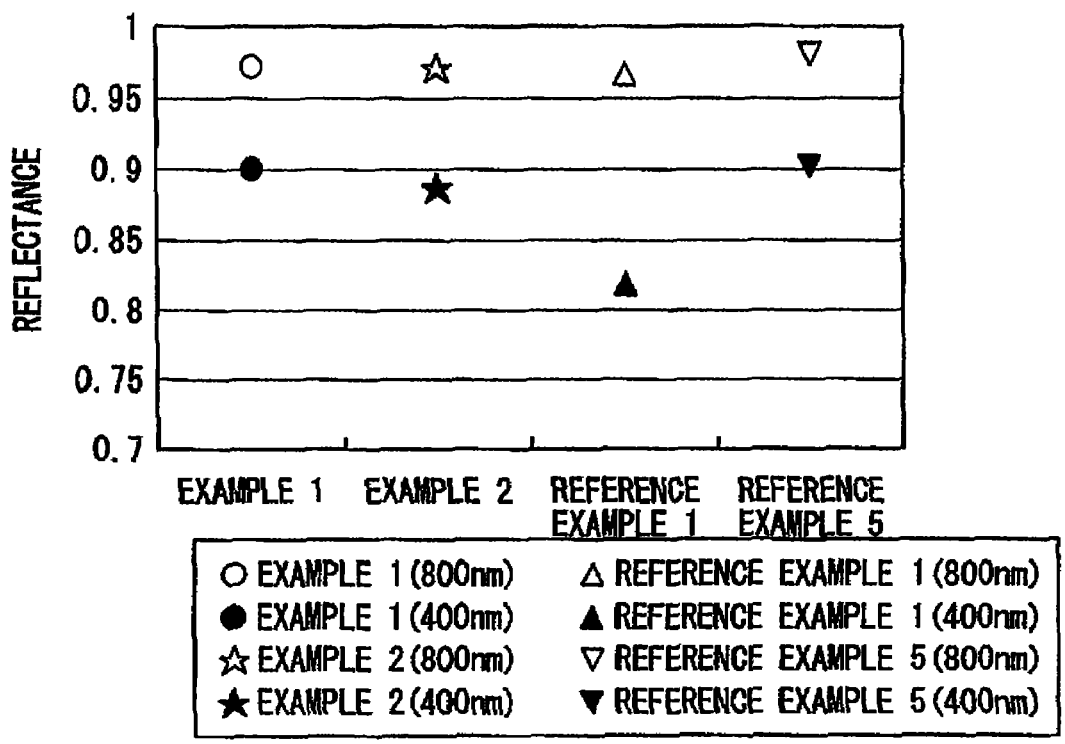
FIG. 17 is a graph showing reflectance of a first electrode of an organic light-emitting device according to an example of the invention pursuant to an embodiment.

As in the case of the second embodiment, the organic light-emitting device was formed. At that time, the first electrode 14 had a structure in which the adhesive layer-cum-auxiliary reflective film 14D made of chromium with a thickness of about 40 nm, the reflective layer 14B made of an alloy including silver with a thickness of about 36 nm, and the barrier layer 14C made of ITO with a thickness of 7.5 nm were laminated. Moreover, the resonant wavelength of the above-described resonator (peak wavelength of the spectrum of light extracted from the second electrode 17) was set to about 400 nm and about 800 nm. In the obtained organic light-emitting device, the reflectance of the first electrode 14 in both cases was determined. The obtained results are shown in FIG. 17.

Figure 18:
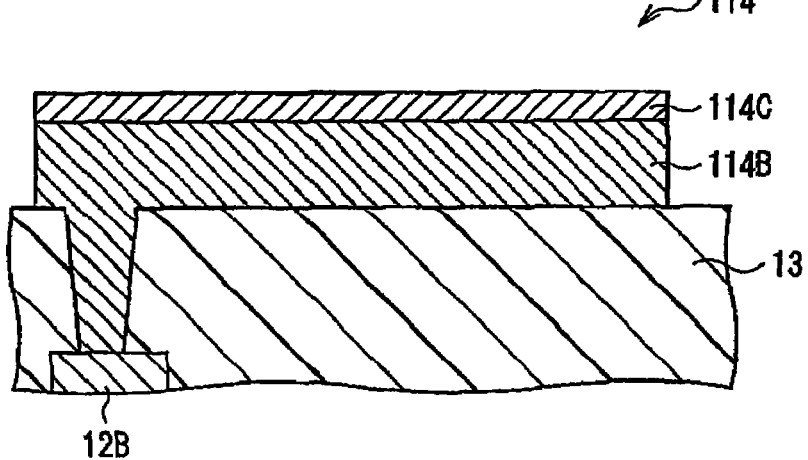
FIG. 18 is a sectional view of a first electrode of an organic light-emitting device according to a reference example of the invention pursuant to an embodiment.

As Reference Examples 1 through 5 relative to the example, as shown in FIG. 18, a first electrode 114 which was equivalent to the example except that the first electrode 114 included only a reflective layer 114B and a barrier layer 114C, and the adhesive layer-cum-auxiliary reflective film was not included. At that time, the thickness of the reflective layer 114B was 36 nm in Reference Example 1, 70 nm in Reference Example 2, 90 nm in Reference Example 3, 110 nm in Reference Example 4 and 150 nm in Reference Example 5. In Reference Examples 1 through 5, the reflectance of the first electrode 114 was determined. The obtained results are shown in FIG. 19, and the results of Reference Examples 1 and 5 are also shown in FIG. 17.

Figure 19:
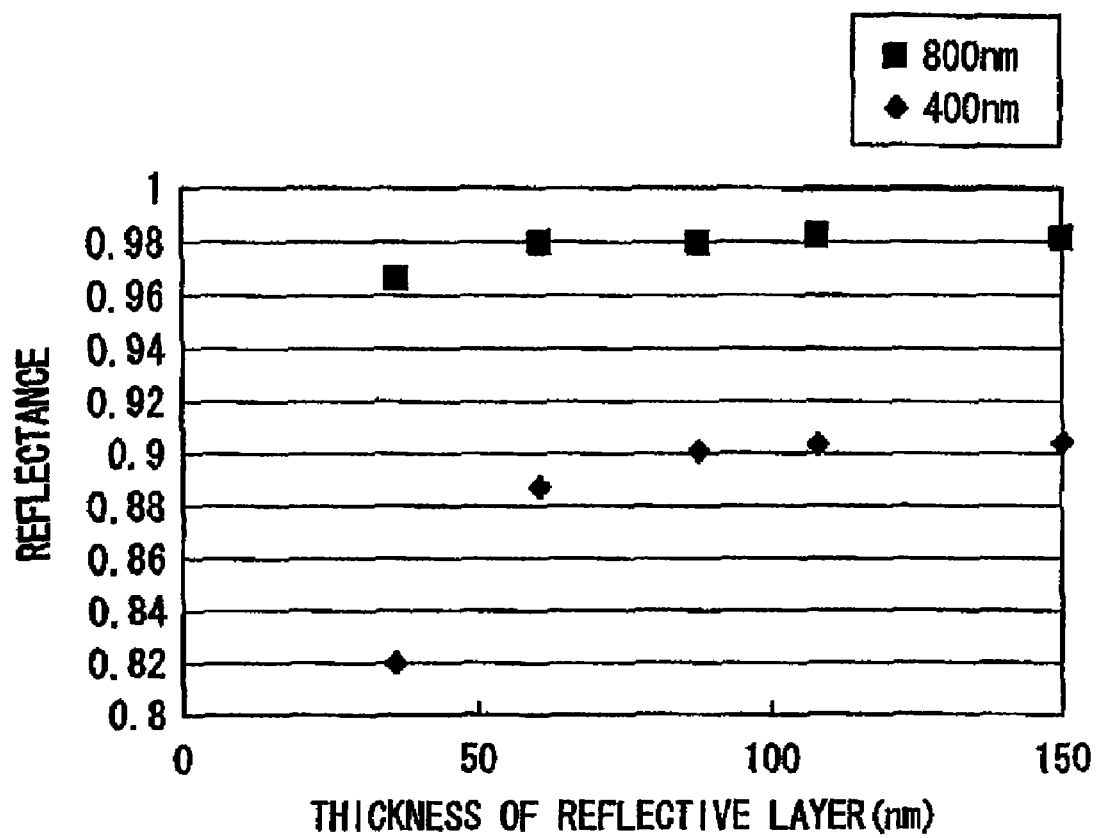
FIG. 19 is a graph of reflectance of the first electrode according to the reference example shown in FIG. 18.

It was evident from FIG. 19 that in Reference Examples 1 through 5 in which the adhesive layer-cum-auxiliary reflective film is not included, the reflectance was declined according to a decrease in the thickness of the reflective layer 114B in both cases of the resonant wavelengths of about 800 nm and about 400 nm. Among them, in Reference Examples 1 through 3 in which the thickness of the reflective layer 114B was about 100 nm or less, a decline in the reflectance specifically in the resonant wavelength of about 400 nm was pronounced. On the other hand, it was obvious from FIG. 17 that in the example in which the adhesive layer-cum-auxiliary reflective film 14D was included, compared to Reference Example 1 having the reflective layer 114B with the same thickness as that in the example, the reflectance was improved in both cases of the resonant wavelengths of about 800 nm and about 400 nm. Specifically in the resonant wavelength of about 400 nm, the same reflectance as that in Reference Example 5 in which the thickness of the reflective layer 114B was about 150 nm could be obtained. In other words, it was found out that when the first electrode 14 included the adhesive layer-cum-auxiliary reflective film 14D, a decline in the reflectance due to a reduction in the thickness of the reflective layer 14B can be offset, and characteristics can be improved.

EXAMPLE 2

The first electrode 14 was formed as in the case of Example 1, except that the thickness of the adhesive layer 14A was about 150 nm. The reflectance thereof was determined, and the same results as those in Example 1 were obtained. The obtained results are shown in FIG. 17.

Although the present invention is described referring to the embodiments and the examples, the invention is not limited to the embodiments and the examples, and is variously modified. For example, the materials and the thicknesses of the layers, film forming methods, film forming conditions and so on are not limited to those described in the embodiments and the examples, and any other materials, any other thicknesses, any other film forming methods and any other film forming conditions may be applicable. For example, the adhesive layer 14A or the adhesive layer-cum-auxiliary reflective film 14D can be formed by not only sputtering, but also vapor deposition, CVD, MOCVD (metal organic chemical vapor deposition), laser ablation, plating and the like. The reflective layer 14B can be also formed by not only sputtering but also vapor deposition, CVD, MOCVD, laser ablation, plating and the like.

Moreover, for example, in the above embodiments and the above examples, the case where the adhesive layer 14A or the adhesive layer-cum-auxiliary reflective film 14D, the reflective layer 14B and the barrier layer 14C are patterned by wet etching is described, they may be patterned by dry etching.

Figure 20A:
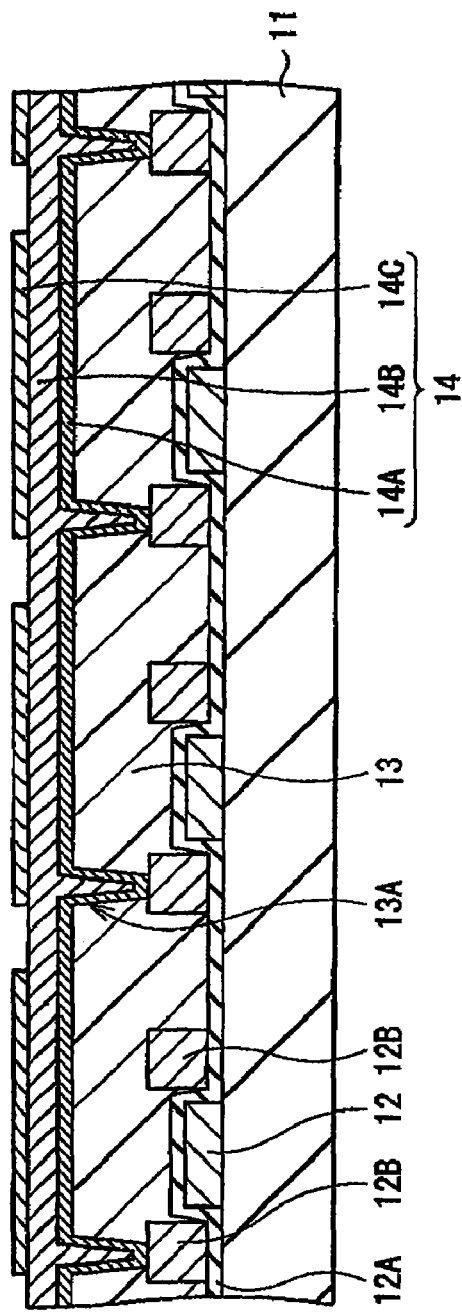
FIGS. 20A and 20B are sectional views for showing modification of the steps shown in FIGS. 6A and 6B.
Figure 20B:
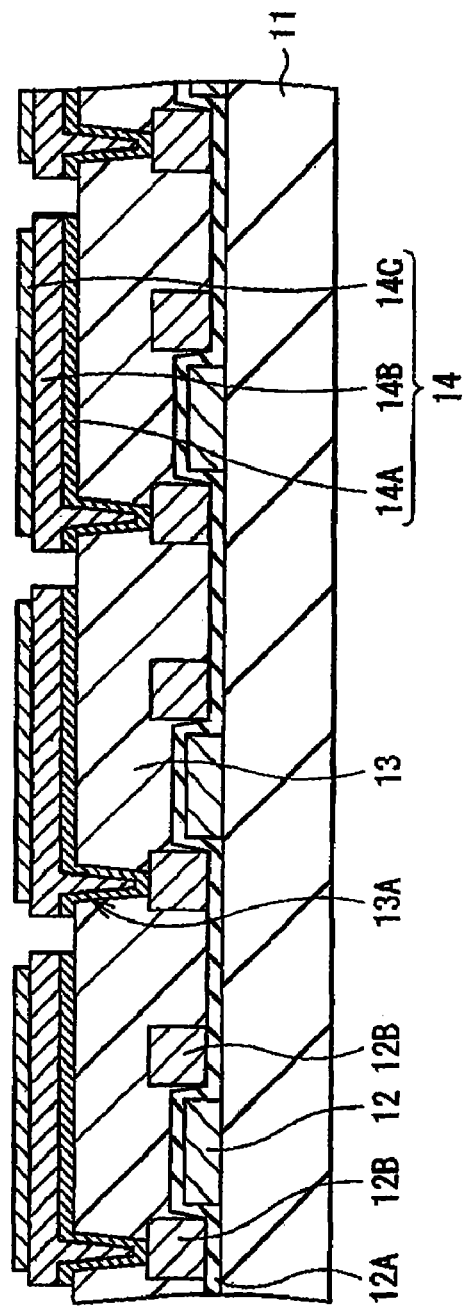

Further, for example, in the embodiments and the examples, the case where after the barrier layer 14C and the reflective layer 14B are patterned, the adhesive layer 14A or the adhesive layer-cum-auxiliary reflective film 14D is patterned is described; however, as shown in FIG. 20A, at first, only the barrier layer 14C is patterned, and then as shown in FIG. 20B, the reflective layer 14B, and the adhesive layer 14A or the adhesive layer-cum-auxiliary reflective film 14D may be patterned. Further, the barrier layer 14C, the reflective layer 14B, and the adhesive layer 14A or the adhesive layer-cum-auxiliary reflective film 14D may be patterned one after another from the barrier layer 14C.

In addition, for example, in the second embodiment, the case where the adhesive layer-cum-auxiliary reflective film 14D having functions as an adhesive layer and an auxiliary reflective film is included is described; however, a laminate structure in which an auxiliary reflective film and an adhesive layer are laminated in this order from the planarizing layer 13 as a base layer may be included.

Further, in the embodiments, the structures of the organic light-emitting devices 10R, 10G and 10B are described in detail; however, each of them does not necessarily include all layers such as the insulating film 15, the auxiliary electrode 17A and the protective film 18, and each of them may further include any other layer. Although the invention is applicable to the case where the second electrode 17 is not a semitransparent electrode but a transparent electrode, and the second electrode 17 does not have a resonator structure, the invention is to enhance the reflectance in the first electrode 14, so in the case where an interface of the first electrode 14 on a side closer to the light-emitting layer 16B and an interface of the second electrode 17 on a side closer to the light-emitting layer 16B are the first end portion P1 and the second end portion P2 respectively, and the organic layer 16 has a resonator structure as a resonant portion, higher effects can be obtained.

In addition, in the embodiments, the case where the invention is applied to the organic light-emitting device or the display unit comprising the organic light-emitting device is described; however, the invention is applicable to any other display unit such as, for example, a liquid crystal display panel.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A light-emitting device comprising: a first electrode, a layer including a light-emitting layer and a second electrode laminated in sequence on a substrate with a base layer in between, and extracting light generated in the light-emitting layer from the second electrode,
   wherein the first electrode includes an adhesive layer disposed in contact with the base layer; a reflective layer disposed on the adhesive layer to reflect the light generated in the light-emitting layer; and a barrier layer disposed on the reflective layer to protect the reflective layer; and
   wherein the reflective layer and the barrier layer are etched into a same shape, wherein the adhesive layer is etched into another shape, and wherein the adhesive layer is provided between the base layer and the reflective layer so that the reflective layer does not contact the base layer directly, and wherein the adhesive layer is etched after the reflective layer and barrier layer are etched, wherein the adhesive layer has a thickness that is greater than any one of the barrier layer and the reflective layer.

2. The light-emitting device according to claim 1, wherein the adhesive layer is made of at least one of a metal, an electrically conductive oxide and a metal compound that include a metal element selected from the group consisting of chromium (Cr), indium (In), tin (Sn), zinc (Zn), cadmium (Cd), titanium (Ti), aluminum (Al), magnesium (Mg) molybdenum (Mo) and combinations thereof.

3. The light-emitting device according to claim 1, wherein the reflective layer includes at least one of silver (Ag) and an alloy including silver.

4. The light-emitting device according to claim 1, wherein the reflective layer is made of an alloy including silver (Ag) and a constituent selected from the group consisting of neodymium (Nd), samarium (Sm), yttrium (Y), cerium (Ce), europium (Eu), gadolinium (Gd), terbium (Tb), dysprosium (Dy), erbium (Er), ytterbium (Yb), scandium (Sc), ruthenium (Ru), copper (Cu), gold (Au) and combinations thereof.

5. The light-emitting device according to claim 1, wherein the reflective layer includes an alloy including silver (Ag), samarium (Sm) and copper (Cu).

6. The light-emitting device according to claim 1, wherein the barrier layer includes a light-transparent film including at least one of a metal, an oxide and a metal compound including at least one kind selected from the group of metal elements consisting of indium (In), tin (Sn), zinc (Zn), cadmium (Cd), titanium (Ti), chromium (Cr), gallium (Ga) and aluminum (Al).

7. The light-emitting device according to claim 1, wherein the barrier layer includes at least one kind selected from the group consisting of a compound including indium (In), tin (Sn) and oxygen (O), a compound including indium (In), zinc (Zn) and oxygen (O), indium tin oxide (ITO), indium zinc oxide (IZO), indium oxide ($In_2O_3$), tin oxide ($SnO_2$), zinc oxide (ZnO), cadmium oxide (CdO), titanium oxide ($TiO_2$), chromium oxide ($CrO_2$), gallium nitride (GaN), gallium oxide ($Ga_2O_3$) aluminum oxide ($Al_2O_3$) and combinations thereof.

8. The light-emitting device according to claim 1, wherein the thickness of the barrier layer ranges from about 1 nm to about 50 nm inclusive.

9. The light-emitting device according to claim 1, wherein the base layer includes a planarizing layer.

10. The light-emitting device according to claim 1, wherein a layer including the light-emitting layer includes an organic layer.

11. The light-emitting device according to claim 1, wherein the adhesive layer also serves as an auxiliary reflective film reflecting light generated in the light-emitting layer and having passed through the reflective layer.

12. The light-emitting device according to claim 11, wherein
the auxiliary reflective film includes at least one of a metal, an electrically conductive oxide, and a metal compound including at least one kind selected from the group of metal elements consisting of chromium (Cr), indium (In), tin (Sn), zinc (Zn), cadmium (Cd), titanium (Ti), aluminum (Al), magnesium (Mg) and molybdenum (Mo).

13. The light-emitting device according to claim 11, wherein the auxiliary reflective film has a reflectance of about 50% or greater.

14. A method of manufacturing a light-emitting device, the light-emitting device comprising a first electrode, a layer including a light-emitting layer and a second electrode laminated in order on a substrate with a base layer in between, the method comprising the steps of:
forming an adhesive layer on the base layer;
forming a reflective layer reflecting light generated in the light-emitting layer on the adhesive layer so that the reflective layer does not contact the base layer;
forming a barrier layer protecting the reflective layer on the reflective layer;
etching the barrier layer and the reflective layer into one shape;
etching the adhesive layer into another shape;
forming the layer including the light-emitting layer on the barrier layer; and
forming the second electrode on the layer including the light-emitting layer.

15. The method of manufacturing a light-emitting device according to claim 14, wherein
the adhesive layer includes at least one of a metal, an electrically conductive oxide and a metal compound including a metal element selected from the group consisting of chromium (Cr), indium (In), tin (Sn), zinc (Zn), cadmium (Cd), titanium (Ti), aluminum (Al), magnesium (Mg), molybdenum (Mo) and combinations thereof.

16. The method of manufacturing a light-emitting device according to claim 14, wherein
the reflective layer includes silver (Ag) or an alloy including silver.

17. The method of manufacturing a light-emitting device according to claim 14, wherein
the reflective layer is made of an alloy including silver (Ag) and at least one-kind selected from the group consisting of neodymium (Nd), samarium (Sm), yttrium (Y), cerium (Ce), europium (Eu), gadolinium (Gd), terbium (Tb), dysprosium (Dy), erbium (Er), ytterbium (Yb), scandium (Sc), ruthenium (Ru), copper (Cu) and gold (Au).

18. The method of manufacturing a light-emitting device according to claim 14, wherein
the reflective layer includes an alloy including silver (Ag), samarium (Sm) and copper (Cu).

19. The method of manufacturing a light-emitting device according to claim 14, wherein
the barrier layer includes a light-transparent film made of at least one of a metal, an oxide and a metal compound including at least one kind selected from the group of metal elements consisting of indium (In), tin (Sn), zinc (Zn), cadmium (Cd), titanium (Ti), chromium (Cr), gallium (Ga) and aluminum (Al).

20. The method of manufacturing a light-emitting device according to claim 14, wherein
the barrier layer includes a material selected from the group consisting of a compound including indium (In), tin (Sn) and oxygen (O), a compound including indium (In), zinc (Zn) and oxygen (O), indium tin oxide (ITO), indium zinc oxide (IZO), indium oxide ($In_2O_3$), tin oxide ($SnO_2$), zinc oxide (ZnO), cadmium oxide (CdO), titanium oxide ($TiO_2$), chromium oxide ($CrO_2$), gallium nitride (GaN), gallium oxide ($Ga_2O_3$) and aluminum oxide ($Al_2O_3$).

21. The method of manufacturing a light-emitting device according to claim 14, wherein
the thickness of the barrier layer ranges from about 1 nm to about 50 nm.

22. The method of manufacturing a light-emitting device according to claim 14, wherein as the layer including the light-emitting layer, an organic layer is formed.

23. A display unit, comprising:

a light-emitting device comprising a first electrode, a layer including a light-emitting layer and a second electrode laminated in order on a substrate with a base layer in between, and extracting light generated in the light-emitting layer from the second electrode, wherein the first electrode includes an adhesive layer disposed in contact with the base layer; a reflective layer disposed on the adhesive layer to reflect the light generated in the light-emitting layer; and a barrier layer disposed on the reflective layer to protect the reflective layer; and wherein the reflective layer and the barrier layer are etched into a same shape, wherein the adhesive layer is etched into another shape, and wherein the adhesive layer is provided between the base layer and the reflective layer so that the reflective layer does not contact the base layer directly, and wherein the adhesive layer is etched after the reflective layer and the barrier layer are etched, wherein the adhesive layer has a thickness that is greater than any one of the barrier layer and the reflective layer.

24. The display unit according to claim 23, wherein the layer including the light-emitting layer includes an organic layer.

\* \* \* \* \*